(12) United States Patent
Srinivasan et al.

(10) Patent No.: US 7,319,602 B1
(45) Date of Patent: Jan. 15, 2008

(54) CONTENT ADDRESSABLE MEMORY WITH TWISTED DATA LINES

(75) Inventors: Varadarajan Srinivasan, Los Altos Hills, CA (US); Sandeep Khanna, Los Altos, CA (US)

(73) Assignee: NetLogic Microsystems, Inc, Mountain View, CA (US)

( * ) Notice: Subject to any disclaimer, the term of this patent is extended or adjusted under 35 U.S.C. 154(b) by 33 days.

(21) Appl. No.: 10/883,158

(22) Filed: Jul. 1, 2004

(51) Int. Cl.
G11C 15/00 (2006.01)
G11C 7/00 (2006.01)

(52) U.S. Cl. .................................. 365/49; 365/189.07

(58) Field of Classification Search ................. 365/49, 365/189.07, 200, 230.03, 51, 63, 203
See application file for complete search history.

(56) References Cited

U.S. PATENT DOCUMENTS

| | | | |
|---|---|---|---|
| 4,045,781 A * | 8/1977 | Levy et al. ..................... 365/49 |
| 5,045,899 A | 9/1991 | Arimoto | |
| 5,062,077 A | 10/1991 | Takashima et al. | |
| 5,136,543 A | 8/1992 | Matsuda et al. | |
| 5,140,556 A | 8/1992 | Cho et al. | |
| 5,276,649 A | 1/1994 | Hoshita et al. | |
| 5,280,443 A | 1/1994 | Hidaka et al. | |
| 5,383,159 A | 1/1995 | Kubota | |
| 5,396,449 A * | 3/1995 | Atallah et al. ................. 365/49 |
| 5,416,734 A | 5/1995 | Hidaka et al. | |
| 5,461,589 A | 10/1995 | Hidaka et al. | |
| 5,488,583 A | 1/1996 | Ong et al. | |
| 5,499,218 A | 3/1996 | Ahn et al. | |
| 5,534,732 A | 7/1996 | DeBrosse et al. | |
| 5,550,769 A | 8/1996 | Hidaka et al. | |
| 5,649,126 A | 7/1997 | Lynch | |
| 5,699,288 A * | 12/1997 | Kim et al. ..................... 365/49 |
| 5,818,786 A | 10/1998 | Yoneda | |
| 6,282,113 B1 | 8/2001 | DeBrosse | |
| 6,292,383 B1 | 9/2001 | Worley | |
| 6,331,942 B1 * | 12/2001 | Peterson ....................... 365/49 |
| 6,442,061 B1 | 8/2002 | Kong et al. | |
| 6,483,733 B2 * | 11/2002 | Lines et al. .................... 365/49 |
| 6,500,706 B1 | 12/2002 | Chi | |
| 6,563,727 B1 * | 5/2003 | Roth et al. ..................... 365/49 |
| 6,570,794 B1 | 5/2003 | Hokenmaier et al. | |
| 6,597,594 B2 * | 7/2003 | Waller .......................... 365/49 |
| 6,646,900 B2 * | 11/2003 | Tsuda et al. ................... 365/49 |
| 6,657,880 B1 | 12/2003 | Callahan | |
| 6,795,325 B1 * | 9/2004 | Inoue ........................... 365/49 |
| 6,803,610 B2 * | 10/2004 | Koolhaas et al. .............. 365/49 |
| 6,807,077 B2 * | 10/2004 | Noda et al. .................... 365/49 |
| 6,879,504 B1 * | 4/2005 | Lien et al. ..................... 365/49 |
| 6,888,730 B2 * | 5/2005 | Foss et al. ..................... 365/49 |
| 6,901,000 B1 * | 5/2005 | Ichiriu et al. .................. 365/49 |

* cited by examiner

Primary Examiner—Trong Phan
(74) Attorney, Agent, or Firm—Shemwell Mahamedi LLP

(57) ABSTRACT

A content addressable memory (CAM) device having CAM cells arranged in rows and columns. A plurality of first data line pairs extend along respective columns of the CAM cells. A plurality of second data line pairs extend along respective columns of the CAM array adjacent the first data line pairs, each second data line pair having a first and second constituent data lines that cross one another at a point along their lengths.

32 Claims, 14 Drawing Sheets

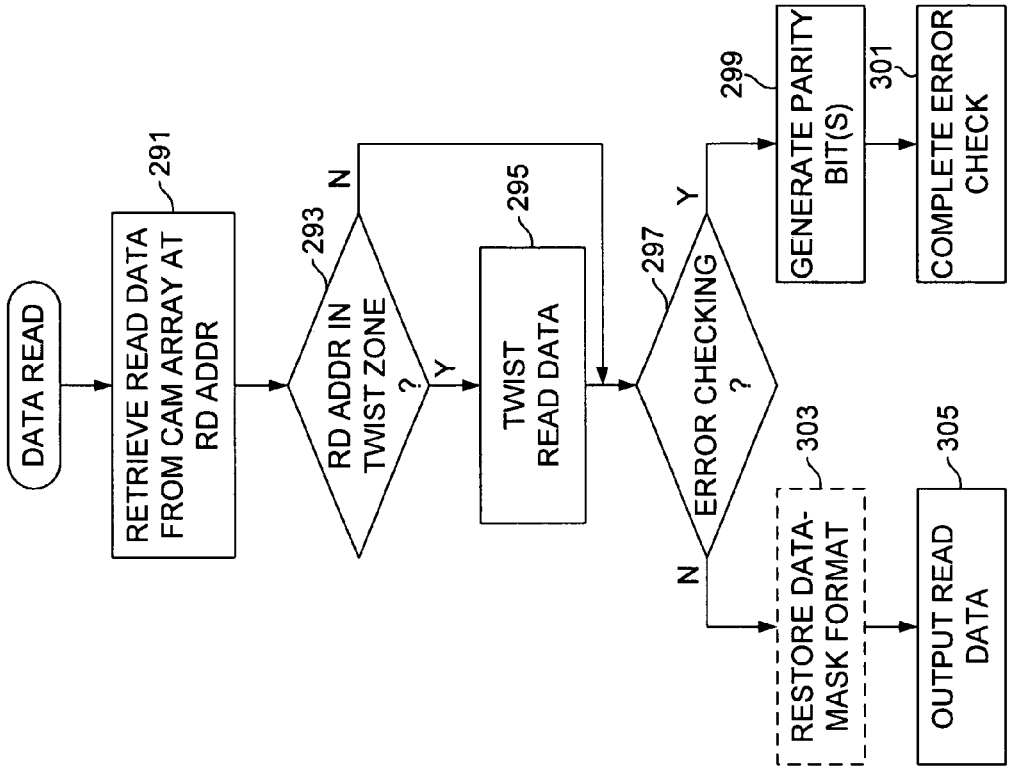
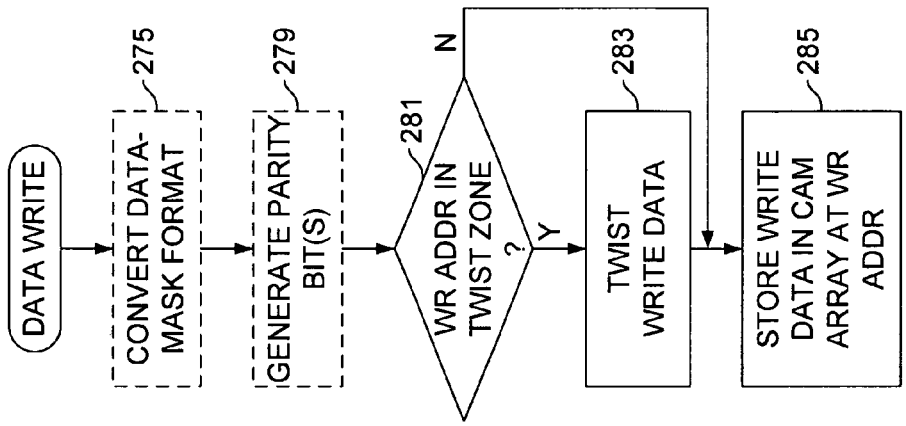

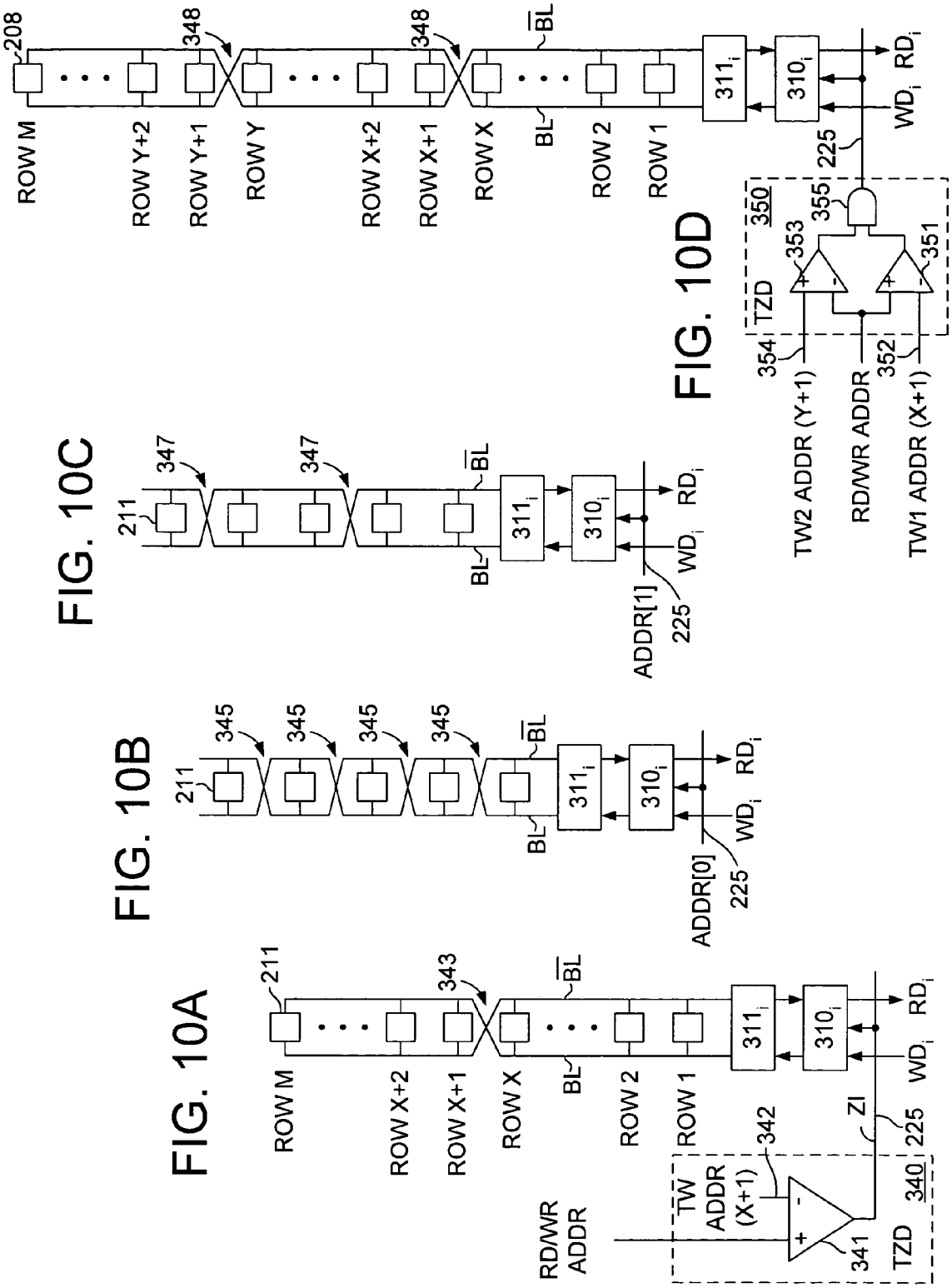

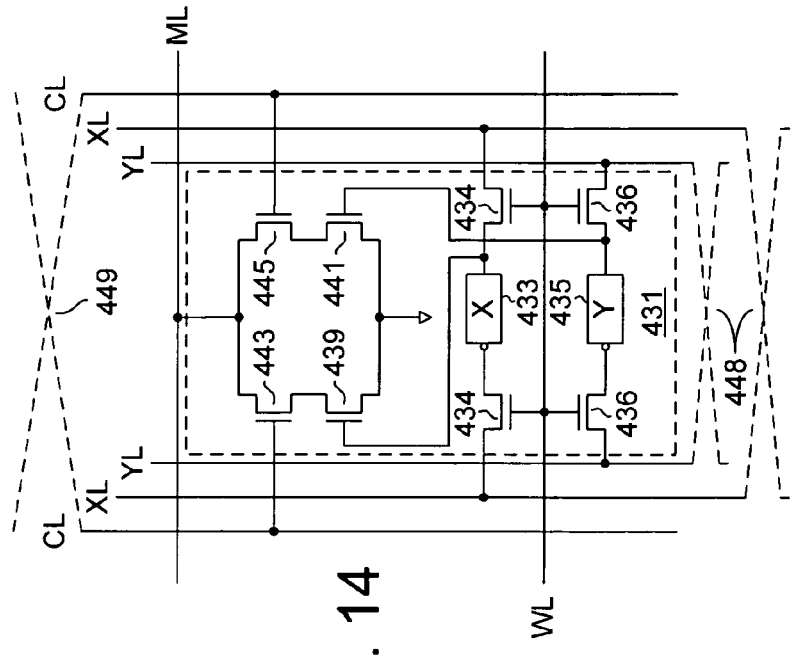
FIG. 14
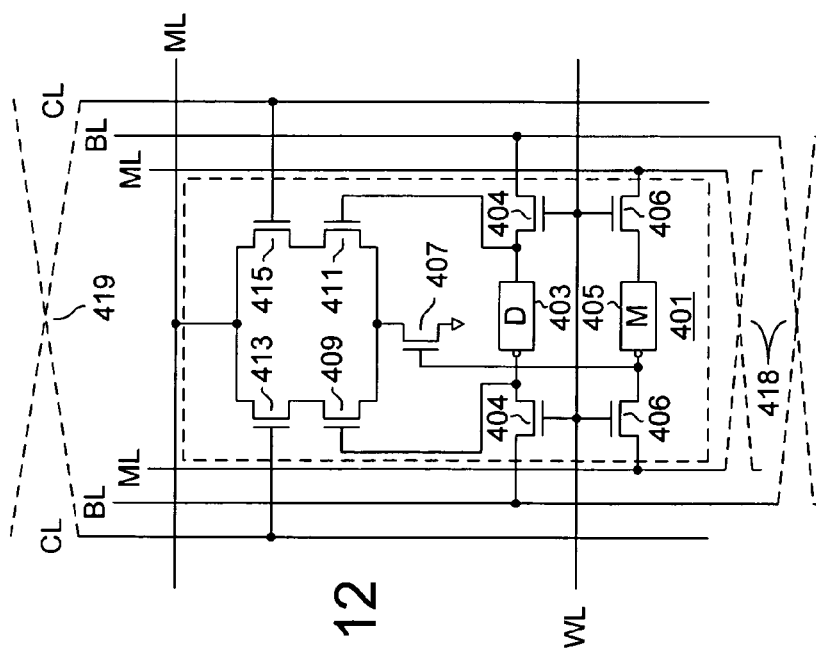
FIG. 12
FIG. 15
FIG. 13

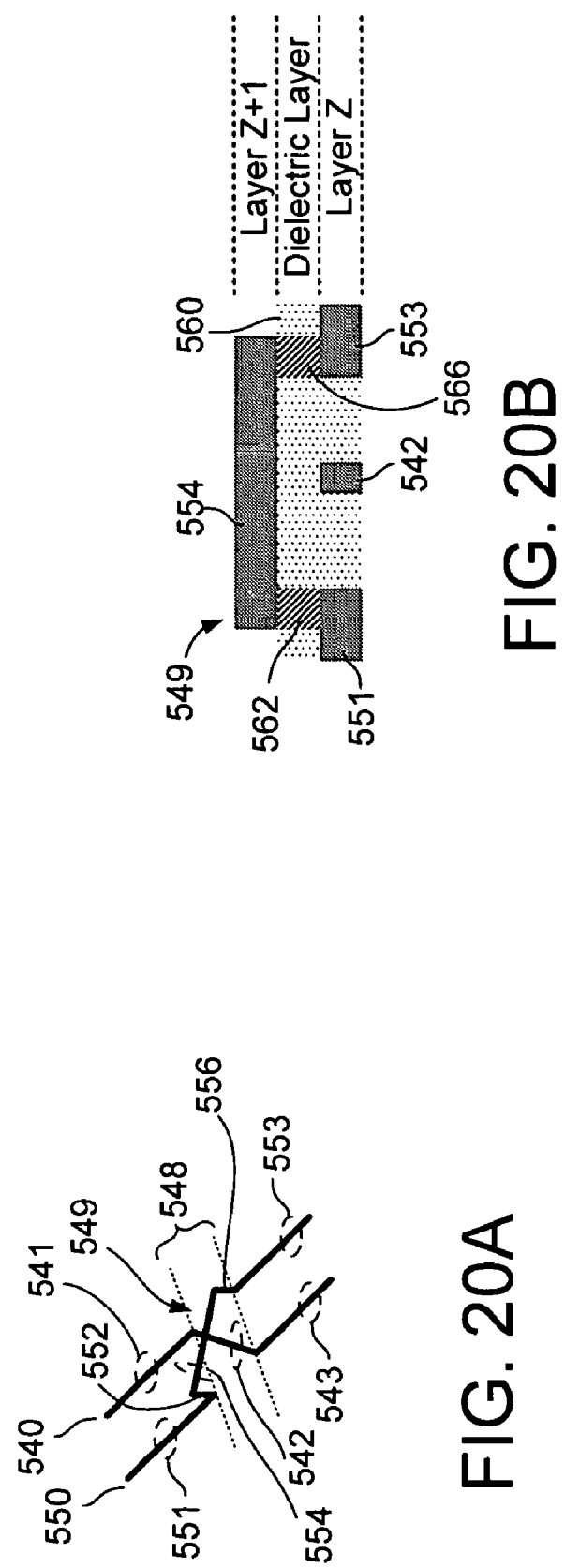

CONTENT ADDRESSABLE MEMORY WITH TWISTED DATA LINES

FIELD OF THE INVENTION

The present invention relates generally to content addressable memory devices, and more particularly to data access and search operations within content addressable memory devices.

BACKGROUND

Content addressable memory (CAM) devices are often used in network switching and routing systems to determine forwarding destinations and permissions for data packets. A CAM device can be instructed to compare search data obtained from an incoming packet with contents of a forwarding or classification database stored in an associative storage array within the CAM device. If the search data matches an entry in the database, the CAM device generates a match address that corresponds to the location of the matching entry, and asserts a match flag to signal the match. The match address is then typically used to address another storage array, either within or separate from the CAM device, to retrieve a forwarding address or other routing information for the packet.

The associative storage array of a CAM device, a CAM array, is typically populated with CAM cells arranged in rows and columns. Precharged match lines are coupled to respective rows of the CAM cells, and bit line pairs and compare line pairs are coupled to respective columns of the CAM cells. Together, the bit line pairs form a data port for read and write access to address-selected rows of CAM cells, and the compare line pairs form a compare port for inputting search data to the CAM array during search operations. The CAM cells themselves are specialized store-and-compare circuits each having a storage element to store a constituent bit of a database entry, referred to herein as a CAM word, and a compare circuit for comparing the stored bit with a search bit presented on the compare lines. In a typical arrangement, the compare circuits within the CAM cells of a given row are coupled in parallel to the match line for the row, with each compare circuit switchably forming a discharge path to discharge the match line if the stored bit and search bit do not match. By this arrangement if any one bit of a CAM word does not match the corresponding bit of the search data, the match line for the row is discharged to signal the mismatch. If all the bits of the CAM word match the corresponding bits of the search data, the match line remains in its precharged state to signal a match. Because search data is presented to all the rows of CAM cells in each compare operation, a rapid, parallel search for a matching CAM word is performed.

FIG. 1 illustrates a prior-art arrangement of compare lines (CL and /CL) and bit lines (BL and /BL), and their interconnection to a corresponding column of CAM cells 101. The bit lines and compare lines each extend along the length of the column of CAM cells and are used to conduct complementary data signals, D and /D, and search signals, C and /C, respectively. The data signals D and /D represent a data bit (D) being written into or read from the data storage element 109 of an address-selected one of the CAM cells 101 during a read or write operation. Search signals C and /C are driven onto the compare lines during a search operation and represent a search bit (referred to herein as a comparand bit, C) to be compared with the data bit stored within each CAM cell 101 via a compare circuit 111.

In the high-density CAM arrays prevalent in modern devices, the compare lines and bit lines typically extend side by side in close proximity across hundreds or thousands of rows of CAM cells and therefore exhibit a substantial parasitic capacitance as shown in FIG. 1. As a result, high frequency search signals driven onto the compare lines tend to propagate through the parasitic capacitance onto the bit lines, and therefore may interfere with data access operations. More specifically, capacitively-coupled transients resulting from charging compare lines may destructively interfere with the relatively small swing differential data signals generated on the bit lines during data read operations, potentially causing an incorrect data state to be read. Such interference is referred to herein as search-read interference.

FIG. 2 illustrates the search-read interference phenomenon in the context of FIG. 1. At time T1, a word line is activated to enable access to one of CAM cells 101, thereby enabling the contents of the data storage element 109 onto the bit lines, BL and /BL. As shown, the bit lines are initially precharged so that, at T1, one of the bit lines (whichever is to carry a logic low signal) begins to be discharged by the low output of the data storage element 109, thus developing a differential potential 118 on the bit lines. In the absence of search-read interference, the differential potential eventually settles to nominal level so that, when a sense amp strobe signal (SAS) is asserted at time T3, a sense amplifier is enabled to amplify the differential bit line potential to a logic level signal that may be captured in downstream logic. Turning to the search operation, a comparand bit is driven onto the compare lines CL and /CL starting at time T2. If the charging compare line is adjacent the discharged bit line (i.e., CL charged and /BL discharged, or /CL charged and BL discharged), then the high-going search signal propagates through the parasitic capacitance (i.e., is capacitively coupled) to the discharged bit line and produces a transient, upward-spiking signal level 120 on the bit line. The resulting loss of differential signal amplitude on bit lines BL and /BL represents a substantial signal degradation and, if the sense amp strobe signal is raised at time T3, may cause the sense amplifier to output an incorrect data state.

One solution to the search-read interference problem is to delay assertion of the sense amp strobe signal until a later time, T4, after the capacitively coupled transient has settled (shown in dashed outline in FIG. 2). Unfortunately, delaying assertion of the sense amp strobe signal directly increases the read cycle time and may detrimentally affect other aspects of device or system operation. Also, as search rates increase in future CAM generations, the shrinking time between search operations may leave insufficient time for capacitively coupled transients to settle.

BRIEF DESCRIPTION OF THE DRAWINGS

The present invention is illustrated by way of example, and not by way of limitation, in the figures of the accompanying drawings and in which like reference numerals refer to similar elements and in which:

FIG. 6 illustrates a data write operation according to an embodiment of the invention;

FIG. 7 illustrates a data read operation according to an embodiment of the invention;

FIGS. 10A-10D illustrate various alternative twisted bit line embodiments;

FIGS. 12 and 13 illustrate an exemplary ternary CAM cell 401 and attendant data twisting operations;

FIGS. 14 and 15 illustrate an exemplary quaternary CAM cell 401 and attendant data twisting operations;

FIGS. 20A and 20B illustrate a perspective view and profile view of a data line crossing arrangement according to an embodiment of the invention.

DETAILED DESCRIPTION

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single-conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "terminal" is used to mean a point of electrical connection. The term "exemplary" is used to express but an example, and not a preference or requirement.

Figure 2:
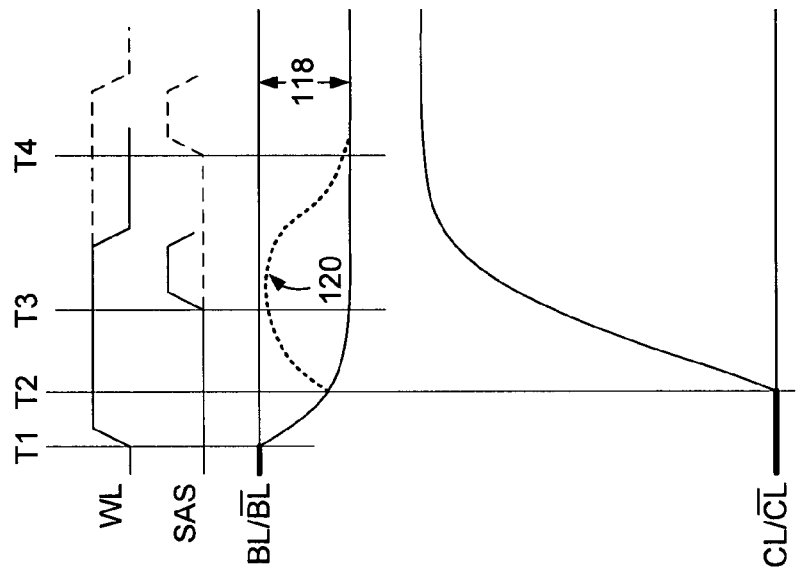
FIG. 2 illustrates search-read interference that may occur in the prior-art arrangement of FIG. 1.
Figure 1:
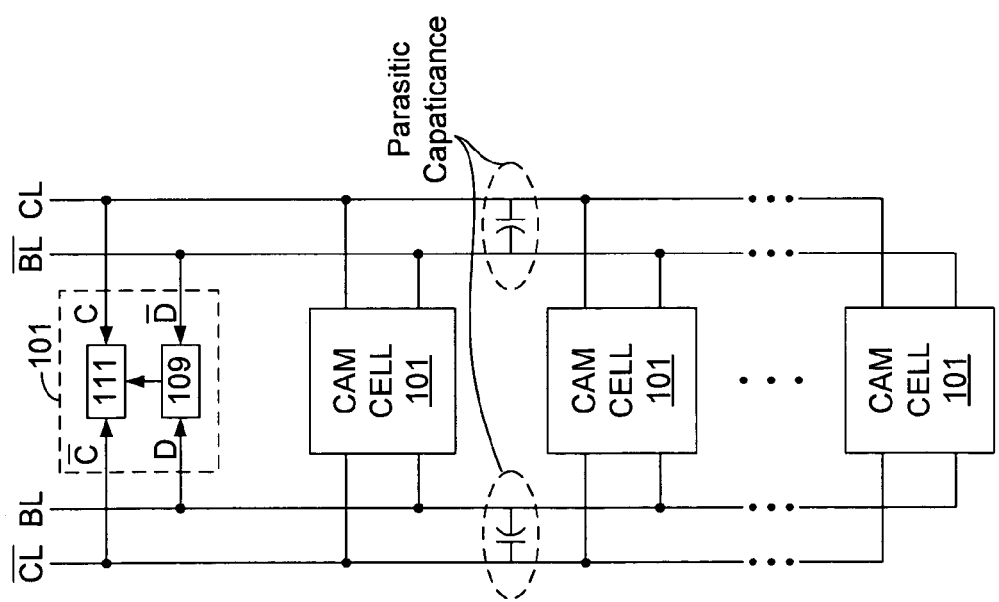
FIG. 1 illustrates a prior-art arrangement of compare lines and bit lines, and their interconnection to a corresponding column of CAM cells.

In embodiments of the present invention, bit lines and compare lines of a content addressable memory (CAM) array are twisted relative to one another at one or more points along their lengths so that the capacitively-coupled transient that results from a charging compare line appears on both bit lines of the corresponding bit line pair. That is, the capacitively-transient shifts the common mode of the differential signal without unduly attenuating the differential amplitude (i.e., results in substantially less attenuation of the differential amplitude than in the prior-art arrangement described in reference to FIGS. 1 and 2). In one embodiment, the bit lines of each bit line pair cross one another at one or more points along their lengths to effect the twist. In another embodiment, the compare lines of each compare line pair cross one another at one or more points along their lengths to effect the twist. Because twisting a bit line pair relative to a compare line pair effectively complements the data bit carried on the bit lines relative to the comparand bit carried on the compare lines, a data twisting circuit is provided to selectively convert data written to and read from the CAM array between twisted and untwisted formats according to the storage location accessed. These and other aspects and embodiments of the invention are discussed below.

Overview of a CAM Device Having a Twisted Bit-Line CAM Array

Figure 3:
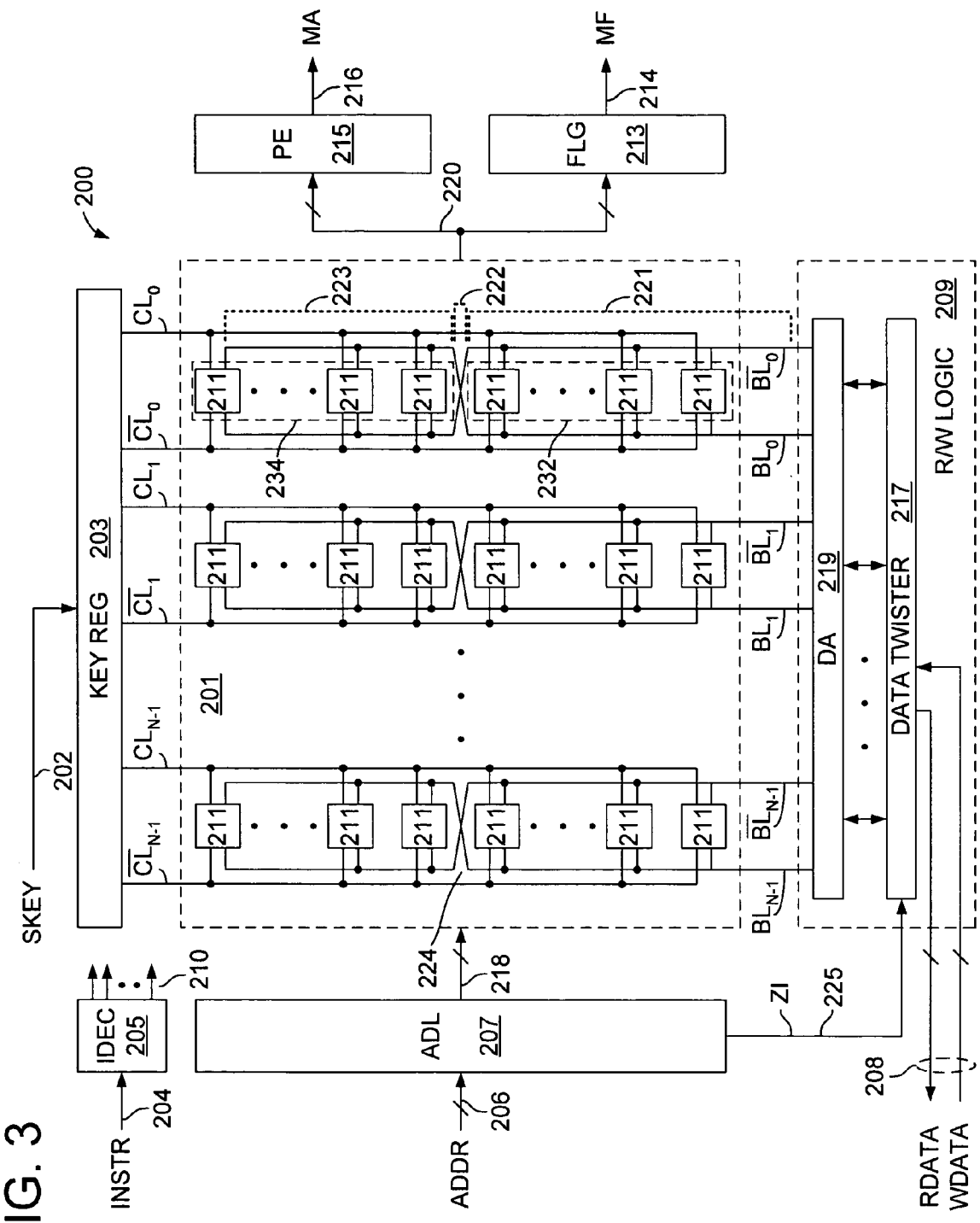
FIG. 3 illustrates a CAM device according to an embodiment of the invention.

FIG. 3 illustrates a CAM device 200 according to an embodiment of the invention. The CAM device 200 includes a CAM array 201, read/write logic ("R/W LOGIC") 209, address logic ("ADL") 207, instruction decoder ("IDEC") 205, key register ("KEY REG") 203, priority encoder ("PE") 215 and flag circuit (FLG") 213. The CAM device 200 may also include other circuit blocks, not shown, to perform functions such as error checking, database maintenance, device configuration (e.g., for configuring logical CAM array dimensions and other run-time options within the CAM device), and so forth.

The instruction decoder 205 receives instructions "INSTR" via an instruction bus 204 (e.g., search instructions, read and write instructions (collectively referred to herein as data access instructions), configuration instructions, etc.) and issues control and timing signals 210 to other circuit blocks within the CAM device 200 as necessary to carry out the instructed operation. The instruction decoder 205 may be implemented by a state machine, micro-sequencer, or any other type of control circuit and may receive or generate one or more clock signals (not shown) for synchronizing state transitions and/or other timing control purposes.

The CAM array 201 includes CAM cells 211 arranged in rows and columns, with each row of CAM cells 211 coupled to a respective one of match lines 220 and to a respective one of word lines 218. Each column of CAM cells 211 is coupled to a respective pair of compare lines ($CL_0$, $/CL_0$-$CL_{N-1}$, $/CL_{N-1}$) and to a respective pair of bit lines ($BL_0$, $/BL_0$-$BL_{N-1}$, $/BL_{N-1}$), the compare lines and bit lines being referred to collectively herein as data lines. The CAM cells 211 themselves may be any type of CAM cells including, without limitation, binary CAM cells, ternary CAM cells and quaternary CAM cells. In the case of ternary and quaternary CAM cells, each CAM cell includes two or more storage elements to enable storage of a mask state (i.e., a "don't care" state) in addition to logic '0' and logic '1' data states. In one embodiment, an additional bit line pair is provided per column of CAM cells for each additional storage element within CAM cell 211. In an alternative embodiment, a single pair of bit lines may be multiplexed to access each storage element within a given column of CAM cells. In such an embodiment, one or more additional word lines may be provided per row of CAM cells to enable selection between the different storage elements (i.e., one word line to enable access to data storage elements within a given row of CAM cells 211, and another word line to enable access to mask storage elements within the row). The storage elements used to store the data state and/or masking state within the CAM cells 211 may be virtually any type of storage element, including volatile storage elements (e.g., back-to-back coupled inverters, thyristor-based storage or other static volatile storage element; or capacitor-based or other dynamic storage elements) and non-volatile storage elements (e.g., floating-gate-based storage elements such as flash EEPROM (electrically erasable programmable read only memory), ferroelectric storage elements, battery backed memory, etc).

Still referring to FIG. 3, the key register ("KEY REG") 203 is used to store search keys "SKEY" (i.e., search data values) received via a search bus 202, and includes compare line driver circuitry coupled to compare line pairs, $CL_0$, $/CL_0$-$CL_{N-1}$, $/CL_{N-1}$. After decoding a search instruction, the instruction decoder ("IDEC") 205 outputs a search enable signal to the key register 203 to enable the compare line driver circuitry to drive constituent bits of a search key SKEY (i.e., comparand bits) in complementary form onto the compare line pairs of the CAM array 201. That is, for a given column of CAM cells 211 within the CAM array, one of the compare lines of the corresponding compare line pair is driven high (i.e., charged) during the search operation, while the other remains discharged. After a predetermined time interval (e.g., after one or more clock signal transitions and/or after an asynchronous delay interval), the search enable signal is deasserted to allow all the charged compare lines to discharge in preparation for a subsequent compare operation. Though not specifically shown in FIG. 3, global masking circuitry may be provided and used to prevent compare line charging for one or more columns of CAM cells 211, thereby masking the corresponding bit positions in all the rows of the CAM array 201. Thus, during a given search operation, as many as half of the compare lines, one per compare line pair, are charged according to the contents of the key register 203, while the remainder remain discharged. In an alternative embodiment, the key register 203 may be omitted and the comparand bits sourced directly from the search bus 202

The comparand bits driven onto the compare line pairs are compared with data values stored within individual CAM cells 211 of the CAM array 201 which, as discussed above, may be in a masked state to prevent mismatch detection. If each CAM cell 211 of a given row indicates a match between an incoming comparand bit and the data value stored within the CAM cells (i.e., due to logical match, or masking), the match line 220 for that row remains in its precharged state to signal the match condition. If a mismatch is detected in one or more CAM cells of a given row, the mismatch-detecting CAM cells 211 form a path to ground to discharge the match line 220 for the row, thereby signaling the mismatch detection. In alternative embodiments, CAM cells 211 may be coupled in series with a pulled-up match line 220 and a mismatch-detecting CAM cell 211 used to interrupt a connection to ground (i.e., in such an embodiment a charged match line 220 may indicate a mismatch condition, while a discharged match line 220 indicates a match condition). Also, regardless of whether the CAM cells 211 are coupled in parallel or series with the match lines 218, the logical states of the match lines used to signal match and mismatch conditions may be reversed in alternative embodiments (i.e., by swapping logic low and logic high voltage connections). The coupling of match lines 220 and word lines 218 to respective rows of CAM cells 211 is not specifically shown in FIG. 3 to avoid obscuring data line (i.e., compare line and bit line) connections to the CAM cells 211.

Still referring to FIG. 3, the flag circuit 213 and priority encoder 215 are both coupled to the match lines 220. The flag circuit 213 asserts a match flag 214 (MF) if, during a search operation, any of the match lines 220 indicate a match condition. The flag circuit 213 may additionally assert a multiple match flag (not shown) if two or more match lines 220 indicate match conditions. Also, during read and write operations, the match flag 214 may be used to signal a full condition within the CAM array 201 (i.e., all rows of CAM cells 211 occupied by a valid entry) and the flag circuit 213 may additionally output an almost-full flag to indicate, for example, that the CAM array 201 is within a predetermined number of entries of being completely filled.

The priority encoder 215 responds to match indications signaled on the match lines 220 by determining a highest-priority matching (HPM) entry (i.e., highest-priority database entry indicated to match the search value), and generating a match address 216 (MA) that corresponds to the storage location of the HPM entry within the CAM array 201. The priority determination may be based on various different criterion including, without limitation, the numerical value of the addresses associated with the key-matching entries (e.g., lower numerical address takes priority over higher numerical address, or vice-versa), the number of unmasked bits within the key-matching entries (e.g., entry having fewer masked bits takes priority over entry having more masked bits, or vice-versa), age of key-matching entries, logical tags within the key-matching entries and so forth. Also, the priority encoder 215 may be programmable to allow relative priorities of database entries to be established by programming (i.e., storing) a priority value for each entry. However match indications are prioritized, the resulting match address 216 may be used to index another storage array within or separate from the CAM device 200, and may also be recorded within an address register (not shown) within the CAM device 200 to enable read and write access to the HPM entry for error-checking and other purposes.

The address logic ("ADL") 207 and read/write logic ("R/W LOGIC") 209 are used to carry out data access operations in response to control signals from the instruction decoder 205. More specifically, addresses "ADDR" are received within the address logic 207 via an address bus 206 (or from one or more internal registers such as a register used to hold the address of an HPM entry (HPM register), next free address (NFA) register, error address register, etc.) and includes decoding circuitry to decode each address to activate a corresponding one of word lines 218. The address logic 207 additionally generates, based at least in part on the selected address (i.e., incoming address or internally stored address) a signal, referred to herein as a zone indicator 225 (ZI). As discussed below, the zone indicator 225 is output to the read/write logic 209 to control conversion of read and write data between twisted and untwisted formats.

Twisted Bit Lines

Figure 4:
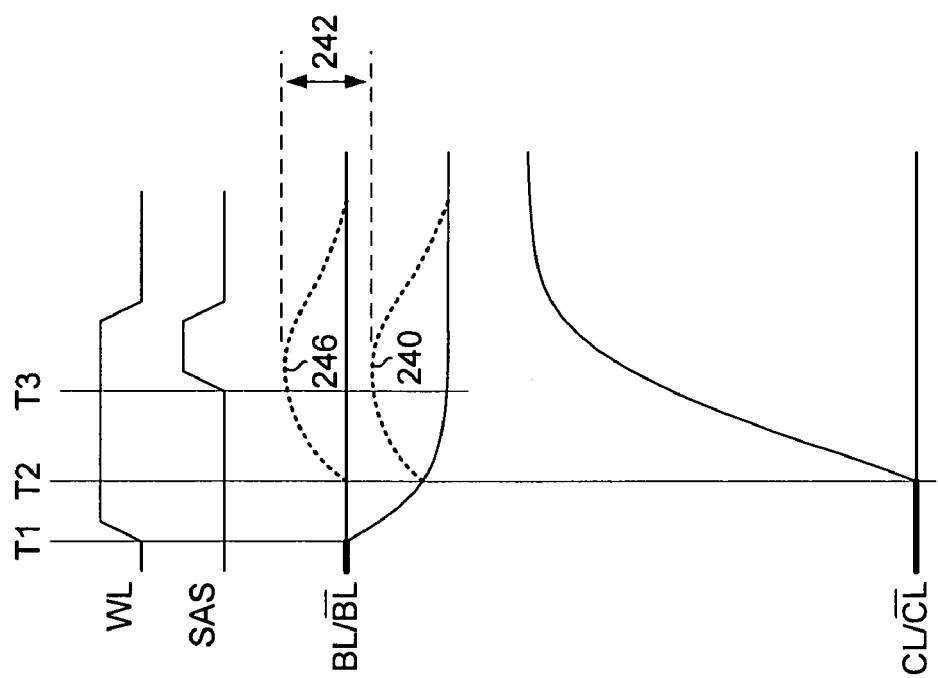
FIG. 4 illustrates a balanced transient coupling onto bit lines of the CAM array of FIG. 3.

In the embodiment of FIG. 3, each bit line pair within the CAM array 201 is twisted at a single point along its length as indicated at 224. That is, the constituent bit lines of each bit line pair extend, from the read/write logic 209, part of the way along the length of a CAM cell column in a first segment 221; turn and cross one another in a second segment 222, referred to herein as a crossing segment; then extend along the remainder of the CAM cell column in a third segment 223. By twisting the bit lines in the crossing segment 222, each constituent bit line of a bit line pair extends adjacent (and in proximity to) a first compare line of the corresponding compare line pair over a first part of its length, and adjacent (and in proximity to) the second compare line of the compare line pair over the remainder of its length. Consequently, as shown in FIG. 4, a charging compare line (i.e. during a search operation) yields a capacitively coupled transient signals 240, 246 on both bit lines of the corresponding bit line pair. By forming the crossing segments 222 of the bit line pairs at a point along the column length that yields a balanced transient coupling onto both bit lines of the bit line pair (e.g., a mid point such as between rows N/2 and (N/2)+1 of an N-row CAM array), the differential amplitude of a signal developed on the bit line pair during a read operation remains substantially unattenuated, with the capacitively-coupled transient merely shifting the common mode. That is, both the low-going bit line and pre-charged bit line (collectively, the differential signal developed in response to assertion of a word line, WL, at time T1) are temporarily driven upward in response to a compare line charging operation initiated at time T2, with a negligible effect on the differential amplitude 242. Accordingly, even if the sense amp strobe signal (SAS) is raised at time T3, when the transient signal level is at a maximum, a correct-state data value may still be captured by a differential sense amplifier. Thus, in contrast to relatively severe differential signal attenuation that results from the asymmetric transient coupling onto the bit lines described in reference to FIG. 1, the twisted bit line arrangement of FIG. 3 may be used to achieve a substantially balanced (i.e., substantially symmetric) transient coupling onto both bit lines of a bit line pair, thereby preserving the differential signal level on the bit line pair and avoiding the need to delay the sense amp strobe signal or otherwise lengthen the read cycle time.

As discussed below, concurrent read and search operations are carried out in various embodiments to enable background error checking of the CAM array contents. By enabling read operations to be carried out at full speed (i.e., without delaying to allow setting of search-induced transients), the cycle time required to error check the entire CAM array may be substantially reduced, thereby reducing the likelihood that data errors (e.g., soft errors) within the CAM array will result in a false match or false mismatch. In other embodiments, a data read operation is performed at the match address to enable error-checking of the key-matching entry and therefore confirmation that a match did not result from a corrupted database entry (e.g., error checking is performed as a final stage of a pipelined search operation). In such embodiments, allowing the data read operation to be carried out at full speed, may reduce the overall latency of the search operation and/or may simplify pipelining of various stages of the search operation.

Data Twist Effect—Twist Zones

Figure 5:
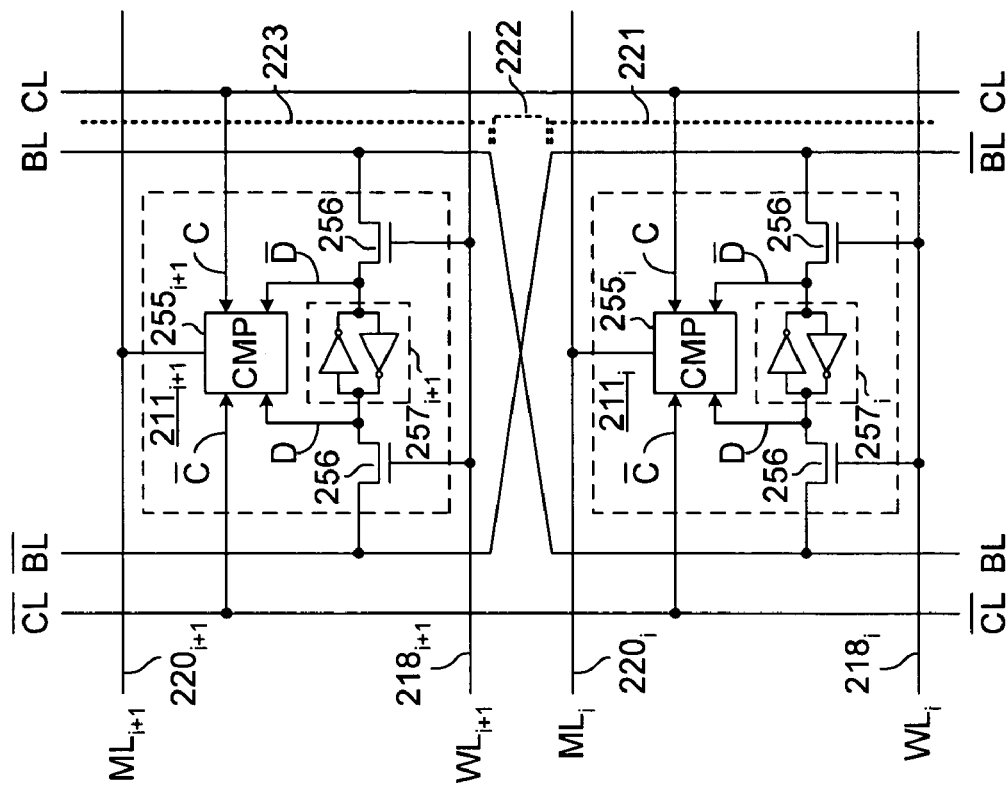
FIG. 5 illustrates a data inversion that occurs due to the crossing segment of a bit line pair within the CAM array of FIG. 3.

Still referring to FIG. 3, the crossing segment 222 of each twisted bit line pair effectively inverts (i.e., twists) the differential data signal conducted to and from CAM cells 211 coupled to the third segment 223 of the bit line pair and thus divides each column of CAM cells 211 (and therefore the CAM array 201) into two logical zones 232 and 234, referred to herein as a twist zone and a normal zone. FIG. 5 illustrates the twist zone data inversion that occurs due to the crossing segment 222 of the bit line pair. As shown, a normal-zone CAM cell $211_i$ ('i' representing a subscript between lower and upper bounds, 0 and N−1 in this case) is coupled to the normal segment 221 of bit line pair BL, /BL via transistors 256 and therefore receives complement data from bit line, /BL, at an inverting node of the data storage element $257_i$ (i.e., the node used to supply complement data bit, /D, to the compare circuit $255_i$) and receives uncomplemented data from bit line, BL, at a non-inverting node of the data storage element (the node used to supply uncomplemented data bit, D, to the compare circuit $255_i$). Accordingly, when a logic '1' value is driven on the bit lines BL and /BL in a write operation directed to CAM cell $211_i$, a logic '1' data value is stored in the storage element $257_i$ (i.e., D='1' and /D='0'). By contrast, due to the twisting of bit lines BL and /BL in the crossing region 222, the inverting and non-inverting nodes of the data storage element $257_{i+1}$ in the twist zone CAM cell $211_{i+1}$ are coupled via transistors 256 to bit lines BL and /BL, respectively (i.e., coupled to the twisted bit line segment 223), an orientation opposite that of normal-zone CAM cell $211_i$. Consequently, when a logic '1' value is driven onto the bit lines BL and /BL in a write operation directed to CAM cell $211_{i+1}$, a logic '0' data value is stored in the storage element $257_{i+1}$ (i.e., D='0' and /D='1'). Thus, CAM cells in the twist zone receive complemented, "twisted" data from the bit lines, while CAM cells in the normal zone receive uncomplemented, "normal" data.

In an ordinary store-and-retrieve memory device, the twisted bit line arrangement of FIG. 3 would be essentially transparent to external devices and systems as data stored in the twist zone is automatically untwisted (i.e., by the crossing segment 222 of each bit line pair) when read back. In a CAM device, however, stored data values are compared with comparand bits so that storing a data value in a complemented format will, in the absence of masking, corrupt the match result, yielding a false mismatch or match indication at each unmasked bit position. In one embodiment, referred to herein as a data twisting embodiment, such false results are avoided by determining whether a read or write operation is directed to a row of CAM cells in the twist zone (i.e., a twist-zone row) and, if so, logically manipulating the read data or write data to cancel the effect of the twisted bit lines. In another embodiment, referred to herein as mixed-cell embodiment, CAM cells in the twist zone are configured differently than normal-zone CAM cells to account for the effect of the twisted bit lines. Both these embodiments are described below in greater detail.

Data Twisting

In a data twisting embodiment, read and write data is selectively converted by the read/write logic (or other circuitry within the CAM device) to counteract the twist-zone data inversion. In the embodiment of FIG. 3, for example, twist zone detection circuitry is provided within the address logic 207 to determine whether a data access operation is directed to a twist-zone row (i.e., as opposed to a normal-zone row) and, if so, to assert the zone indicator 225. The zone indicator 225 is supplied to a data conversion circuit 217, referred to herein as a data twister, within the read/write logic 209. If the zone indicator 225 is asserted (e.g., to a logic high state), thus indicating a read or write operation directed to a twist-zone row, the data twister 217 converts (i.e., twists) the data being written to or read from the CAM array 201 to cancel the effect of the twist zone inversion. More specifically, in the case of a write operation in the twist zone, the data twister 217 logically twists write data received via path 208 (WDATA) so that, when driven onto the twisted bit lines by a write driver component of driver/amplifier circuit 219 (DA) of the read/write logic 209, the data twist effected by the data twister 217 and the data twist effected by the crossing segment 222 of the twisted bit lines will cancel one another. That is, the data twister twists the incoming write data so that, when stored in the twist-zone row, the data will have the same state as if the incoming write data were stored in a normal-zone row. In the case of a read operation, the data twister 217 logically twists read data received from a sense amplifier component of the driver/amplifier circuit 219 of the read/write logic to cancel the effect of the crossing segment 222, thus outputting the read data (RDATA) onto path 208 in the same state as though read, without logical twist, from a normal-zone row. The component signal paths (i.e., carrying write data and read data) of signal path 208 may be coupled via a data direction selector to a shared signal path (e.g., a data bus) or, in an alternative embodiment, may be replaced by a shared signal path. More generally, any of the signal paths 202, 204, 206, 208 used to transmit read data, write data, addresses, instructions, search keys, search results (i.e, match addresses and/or match flags), or other information may be eliminated and the signals otherwise transmitted thereon multiplexed onto another of the signal paths.

FIG. 6 illustrates a data write operation 270 according to an embodiment of the invention. At block 275, a data-mask format conversion is optionally performed (the optional nature being indicated by the dashed outline) to convert mask and data bits of a write data value into an encoded data-mask format. In one embodiment, for example, each incoming data-mask bit pair in a write data word is converted to encoded format, referred to herein as a quaternary format (or XY format) as follows:

TABLE 1

| Mask Bit | Data Bit | X-Bit | Y-Bit |
|---|---|---|---|
| 0 | 0 | 0 | 1 |
| 0 | 1 | 1 | 0 |
| 1 | 0 | 0 | 0 |
| 1 | 1 | 0 | 0 |

As discussed below, the quaternary format may allow use of CAM cells having fewer transistors than CAM cells used to store non-encoded mask and data bits. In alternative embodiments, other encoding formats may be used including, without limitation, conversions of groups of data/mask bit pairs into group-encoded formats.

Still referring to FIG. 6, at block 279, parity bits or other error-checking bits are optionally generated based on the encoded-format write data value (or the non-encoded write data value if no encoding is performed). As discussed below, the error-checking bits may be used to perform background error checking operations and to determine whether a given match address has resulted from a corrupted database entry. At decision block 281, the write address is evaluated to determine whether the row of CAM cells into which data is to be written (i.e., the target row) is located in a twist zone. As discussed below, there may be more than one twist zone within the CAM array. If the target row of CAM cells is in a twist zone, the write data is twisted at block 283 to counteract the twist zone inversion. Otherwise, the target row of CAM cells is in a normal zone and the twist operation is bypassed. At block 285, the write data is stored in the CAM array at the write address. In an alternative embodiment, parity bit generation (or generation of other error checking information) may be performed as a final operation prior to writing data instead of prior to the data twisting operation.

FIG. 7 illustrates a data read operation 290 according to an embodiment of the invention. At block 291, read data is retrieved from the CAM array at the read address. If the read address corresponds to a row of CAM cells in the twist zone (i.e., determined at decision block 293), the read data is twisted at block 295, in effect, restoring the read data to the state it would have if read from a row in the normal zone. If the read address corresponds to a normal-zone row, the data twist operation at block 295 is bypassed. If the read operation is being carried out for error-checking purposes (determined at decision block 297), parity bits or other error-checking information is generated at block 299 and compared with stored error-checking information (i.e., stored with or otherwise associated with the read data) at block 301 to complete the error checking operation. If an error checking operation is not being performed, the read data is optionally restored to a data-mask format in block 303 (e.g., converting from quaternary format to data-mask format, the inverse of the logical operation performed at block 275 of FIG. 6) then output as read data at block 305. In an alternative embodiment, error checking may be performed for all read operations. Also, in an embodiment in which error checking information is generated as a final operation prior to writing data (i.e., after data twisting), error checking may be performed on the read data obtained at block 291, prior to the conditional data twist operation effected by blocks 293 and 295.

Figure 8:
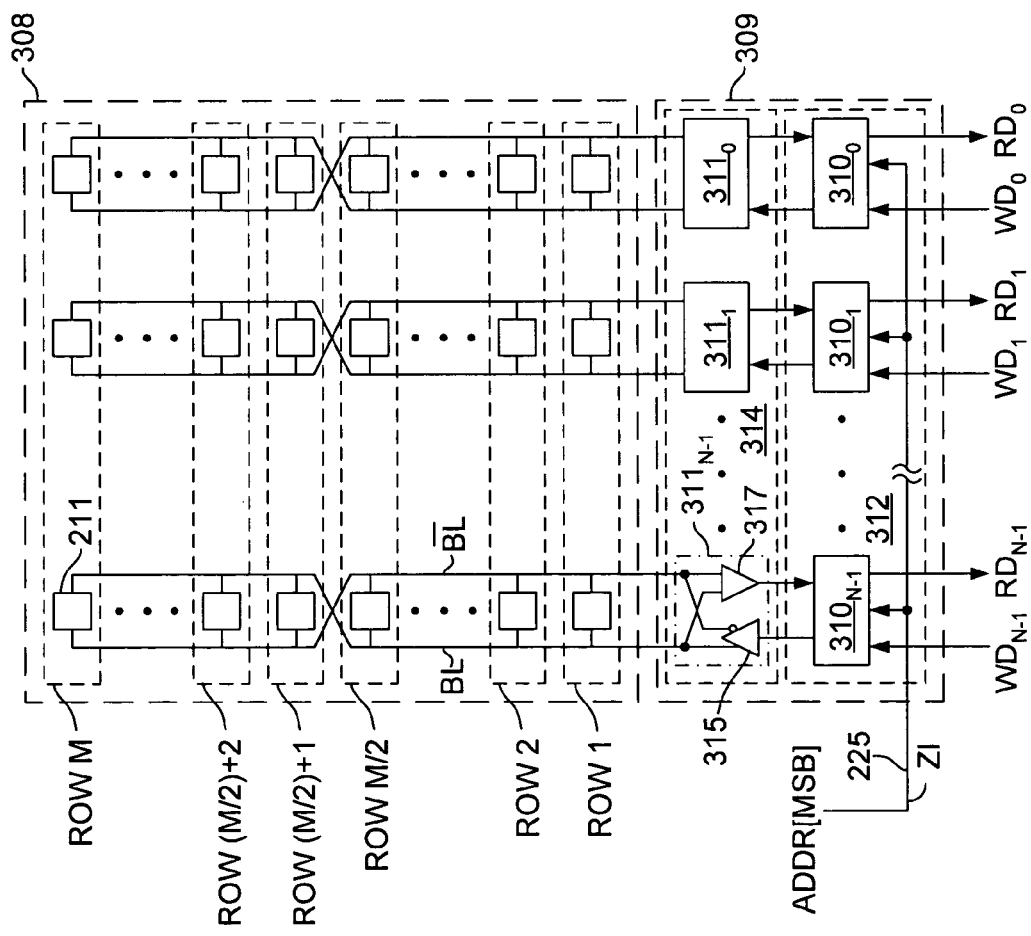
FIG. 8 illustrates a CAM array and read/write logic according to an embodiment of the invention.

FIG. 8 illustrates a CAM array 308 and read/write logic 309 according to an embodiment of the invention. The CAM array 308 includes M rows of CAM cells 211 numbered 1 to M, and twisted bit lines BL, /BL having a single crossing segment disposed in the center of the CAM array 308 between rows M/2 and (M/2)+1. By this arrangement, half the rows of CAM cells 211, rows M/2+1 to M, are disposed in a twist zone and the other half, rows 1 to M/2, are disposed in a normal zone. Accordingly, the most significant bit of each read or write address "ADDR[MSB]" (or at least the most significant bit of the row address portion of the read or write address) may be used to determine whether the twist zone or normal zone is being accessed and therefore constitutes the zone indicator 225 supplied to the read/write logic 309. Though not specifically shown, compare lines, word lines and match lines extend through the CAM array 308 as discussed in reference to FIG. 3.

Figure 9A:
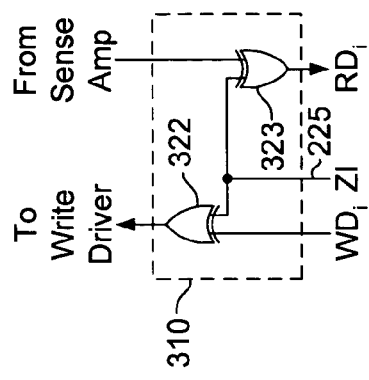
FIG. 9A illustrates a bit-twist circuit according to one embodiment.

The read/write logic 309 includes a data twister 312 having a bank of N of bit-twist circuits $310_0$-$310_{N-1}$, and a driver/amplifier circuit 314 having a corresponding bank of N bit-line driver/amplifiers $311_0$-$311_{N-1}$. In one embodiment, illustrated in FIG. 9A, each of the bit-twist circuits 310 includes a write twist gate 322 and a read twist gate 323 implemented, for example, by respective exclusive-OR gates. The zone indicator (ZI) is supplied to a first input of the write twist gate 322 and a first input of the read twist gate 323. The second input of the write twist gate 322 is coupled to receive an incoming write data bit, $WD_i$ (which may or may not have been generated by a data-mask conversion circuit), and the output of the write twist gate 322 is coupled to an input of a differential bit line driver 315 (which is coupled, in turn, to the bit line pair for a column of CAM cells 211) within the corresponding bit-line driver/amplifier 311. The second input of the read twist gate 323 is coupled to the output of a differential sense amplifier 317 within the corresponding bit-line driver amplifier 311, the sense amplifier 317 being coupled, in turn, to the bit line pair of a column of CAM cells 211. By this arrangement, if the zone indicator 225 (e.g., MSB of the row address) is high, as in the case of a read or write access directed to a twist-zone row, the read or write data bit supplied to each bit-twist circuit 310 will be complemented at the output of the constituent read or write twist gates 322, 323. If the read or write access is directed to a normal-zone row, the zone indicator 225 will be low, thereby enabling the read or write data bit to pass through the read or write twist gate 322, 323 without change. Thus, a write data value to be stored in any of the twist-zone rows (i.e., (M/2)+1 to M) is complemented by the data twister 312, canceling the data inversion effected by the crossing segment of the twisted bit lines. By contrast, a write data value to be stored in any of the normal-zone rows (1 to M/2) passes through the data twister 312 without change. Accordingly, regardless of whether written to a twist-zone row or normal-zone row, an incoming write data value will be stored in the same state in relation to search values presented on the compare lines of the CAM array 308. Similarly, data words read from twist-zone rows are complemented by the data twister 312 to cancel the data inversion effected by the crossing segment of the twisted bit lines, while data words read from normal-zone rows pass through the data twister 312 without change.

Figure 9B:
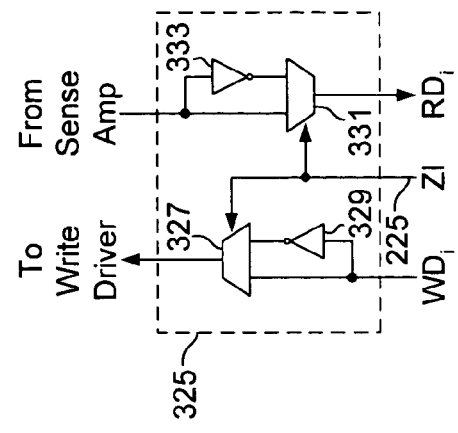
FIG. 9B illustrates a bit twist circuit according to an alternative embodiment.

FIG. 9B illustrates an alternative bit-twist circuit 325 that may be used in place of bit-twist circuit 310 within the data twister 312 of FIG. 8. The bit-twist circuit 325 includes a write path multiplexer 327, write bit inverter 329, read path multiplexer 331 and read bit inverter 333. A write data bit, $WD_i$, is supplied to a first input of the write path multiplexer 327 and to an input of the write bit inverter 329. The complemented write bit (/$WD_i$) generated by the write bit inverter 329 is supplied to a second input of the write path multiplexer 327, and the output of the write path multiplexer 327 is coupled to a bit line driver (e.g., element 315 of FIG. 8). Similarly, a read data bit received from a sense amplifier (e.g., element 317 of FIG. 8), is supplied to a first input of the read path multiplexer 331 and to the input of the read bit inverter 333. The complemented read bit generated by the read bit inverter 333 is supplied to a second input of the read path multiplexer 331, and the output of the read path multiplexer 331 constitutes a read data bit, $RD_i$, that is delivered to a data bus (or to a data-mask restoration circuit and/or error checking circuit). The read and write path multiplexers 327 and 331 each have control inputs coupled to receive the zone indicator 225 so that, when the zone indicator is asserted, the read and write path multiplexers 327, 331 pass the complemented read and write bits to the multiplexer outputs and, when the zone indicator is deasserted, the read and write path multiplexers 327, 331 pass the uncomplemented read and write data bits to the multiplexer outputs.

FIGS. 10A-10D illustrate various alternative twisted bit line embodiments. In the embodiment of FIG. 10A, the crossing segments of the bit line pairs (only one bit line pair is depicted) are not disposed at the midpoint of the CAM array as in FIG. 8, but rather are offset from the midpoint by a predetermined number of rows to more equally balance the capacitive coupling of transient signals onto the bit lines for each column of CAM cells 211. In one embodiment, for example, the compare line driver circuitry is disposed at one side (or at least nearer to one side) of the CAM array and the capacitive compare-line-to-bit-line coupling is greater on the bit line segment nearer the compare line driver circuit (e.g., either the normal zone segment or the twist zone segment) than the bit line segment further from the compare line driver circuit (i.e., the remote bit line segment). To compensate for the stronger coupling on the compare-side bit line segment (i.e., the bit line segment nearer the compare line driver circuit) and balance the transient coupling, the crossing segment may be disposed closer to the compare line driver, shortening the compare-side bit line segment and lengthening the remote bit line segment. For example, as shown in FIG. 8, the crossing segment 343 may be disposed between rows X and X+1 of a CAM array having rows 1 to M, where X is greater than or less than M/2. To determine when a read or write address falls within the twist zone, the address logic includes a twist zone detect circuit ("TZD") 340 to compare the data access address (RD/WR ADDR) with a threshold address value referred to herein as a twist address (TW ADDR). In the particular embodiment of FIG. 10A, the twist zone detect circuit 340 includes a comparator 341 to receive the data access address at a first input and a twist address 342 that corresponds to row X+1 of the CAM array at a second input. If the data access address exceeds or equals the twist address 342, then the data access is directed to a twist-zone row and the comparator 341 outputs a logic-high zone indicator 225 to enable a data twisting operation in each bit-twist circuit 310 of the data twister (only one of which, $310_i$, is shown in FIGS. 10A-10D along with a corresponding bit-line driver/amplifier $311_i$). If the twist address 342 exceeds the data access address (i.e., access address is equal to or less than X), the comparator 341 outputs a logic-low zone indicator 225 to enable read and write data to pass unchanged through each bit-twist circuit 310 of the data twister. Note that if the twist address 342 falls on a power of 2 boundary, one or more least significant bits of the address values need not be provided to the twist detect circuit 340. For example, if rows 0-503 of a 1024 row CAM array are normal-zone rows, and rows 504-1023 are twist zone rows, the three least significant bits of the data access address and twist address 342 may be dropped from the comparison as any 10-bit row address in which the most significant 7 bits are equal to or greater than '0111111b' ('b' indicating binary) will activate a word line for a twist-zone row and any row address in which the most significant 7 bits are less than '0111111b' will activate a word line for a normal-zone row FIG. 10B illustrates a twisted bit line embodiment having multiple crossing segments 345, one after each row of CAM cells 211. In such an embodiment, the least significant bit (LSB) of the row address (e.g., ADDR[0]) indicates whether a read or write is directed to a twist-zone row or normal-zone row and therefore may be used to selectively enable data twisting within the bit-twist circuits 310. That is the LSB of the row address constitutes the zone indicator 225. FIG. 10C illustrates another twisted bit line embodiment having multiple crossing segments 347 disposed after every two rows of CAM cells 211. In such an embodiment, the next-to-leastsignificant bit of the row address (e.g., ADDR[1]) indicates whether access is directed to a twist-zone or normal-zone row and may therefore be output as the zone indicator 225 to the bit twist circuits 310 of the data twister. In other embodiments, crossing segments of the bit lines BL and /BL may be disposed at other power-of-two row intervals (e.g., 4, 8, 16, . . . ) and the corresponding bit of the row address used as the zone indicator 225. Multiple crossing segments disposed at non-power of two intervals (e.g., every 100 rows of CAM cells or other interval) may be used in alternative embodiments with appropriate twist zone detect logic (e.g., address comparison circuitry) provided to determine whether a given access address corresponds to a twist-zone row or normal-zone row.

FIG. 10D illustrates a twisted bit line embodiment having an even number of crossing segments 348, thereby forming a non-equal number of twist zones and normal zones. In the particular embodiment shown, the two crossing segments 348 form a single twist zone that encompasses rows X+1 to Y, and two normal zones that collectively encompass rows 1 to X and Y+1 to M. By selecting Y to equal (or substantially equal) 2x, the total number of normal-zone rows is substantially equal to the number of twist-zone rows. Alternatively, Y and X may be selected as necessary to achieve a desired transient balancing on the bit line pairs. In either case, a twist-zone detect circuit 350 is provided to determine whether a given access address corresponds to a twist-zone row or normal-zone row. In the particular embodiment of FIG. 10D, the twist zone detect circuit 350 (TZD) includes a first comparator 351 to compare the access address (RD/WR ADDR) with a first twist zone address, TW1ADDR(X+1) which is received at input 352 of comparator 351, a second comparator 353 to compare the access address with a second threshold twist zone address, TW2ADDR(Y+1) which is received at input 354 of comparator 353, and a logic AND gate 355 coupled to receive the comparison results from the comparators 351 and 353. Comparator 351 outputs a logic high comparison result if the access address is equal to or greater than X+1, and a logic low comparison result otherwise. Comparator 353 outputs a logic low comparison result if the access address is equal to or greater than Y+1, and a logic high comparison result otherwise. By this arrangement, the logic AND gate 355 outputs a high zone indicator 225 whenever the access address falls within the twist-zone address range. X+1 to Y, inclusive, and a logic-low zone indicator 225 whenever the access address falls within either of the two the normal-zone address ranges, 1 to X and Y+1 to M. In alternative embodiments, the bit lines BL and /BL may include additional crossing segments to form additional twist zones, and the twist zone detect circuit 350 may include additional comparators and logic gates to determine whether read and write addresses falls within a twist zone address range. Also, one or more of the twist zones may fall on a power of two boundary so that one or more bits of the access address may be supplied to logic gates in place of comparison results.

Twisted Compare Lines

In the embodiments of FIGS. 3, 5, 8 and 10A-10D, the bit lines are twisted at one or more points along their lengths to balance the capacitive coupling between each individual compare line of the CAM array and the two bit lines of the corresponding bit line pair. Such balancing is achieved in alternative embodiments of the invention by twisting the compare lines at one or more points along their lengths. Thus, considering both the bit lines and the compare lines to be data lines (i.e., bit lines carrying read and write data, compare lines carrying search data), so long as the constituent signal lines of one data line pair in each column of the CAM array, either the bit lines or compare lines, are twisted at one or more points along their lengths, then the bit lines and compare lines are twisted relative to one another in a manner that may mitigate asymmetric transient signal coupling. One advantage of twisting the compare lines instead of bit lines is that fewer total data line crossings may be required, particularly in systems having multiple bit line pairs per column of CAM cells. Referring to FIG. 3, for example, if the CAM cells are ternary or quaternary CAM cells, two bit line pairs may be provided per CAM cell column, with both bit line pairs including crossing regions at the same (or different) locations along the length of the column. By contrast, the compare lines may be crossed at one or more locations, effecting substantially the same relative data line twisting as crossing both pairs of bit lines. As discussed below, data twisting and mixed-cell embodiments may be used to maintain coherence between stored data and search data in twist zones. Also, the logical operations used to carry out data twisting in twisted compare line embodiments may differ from those used in twisted bit line embodiments.

Figure 11:
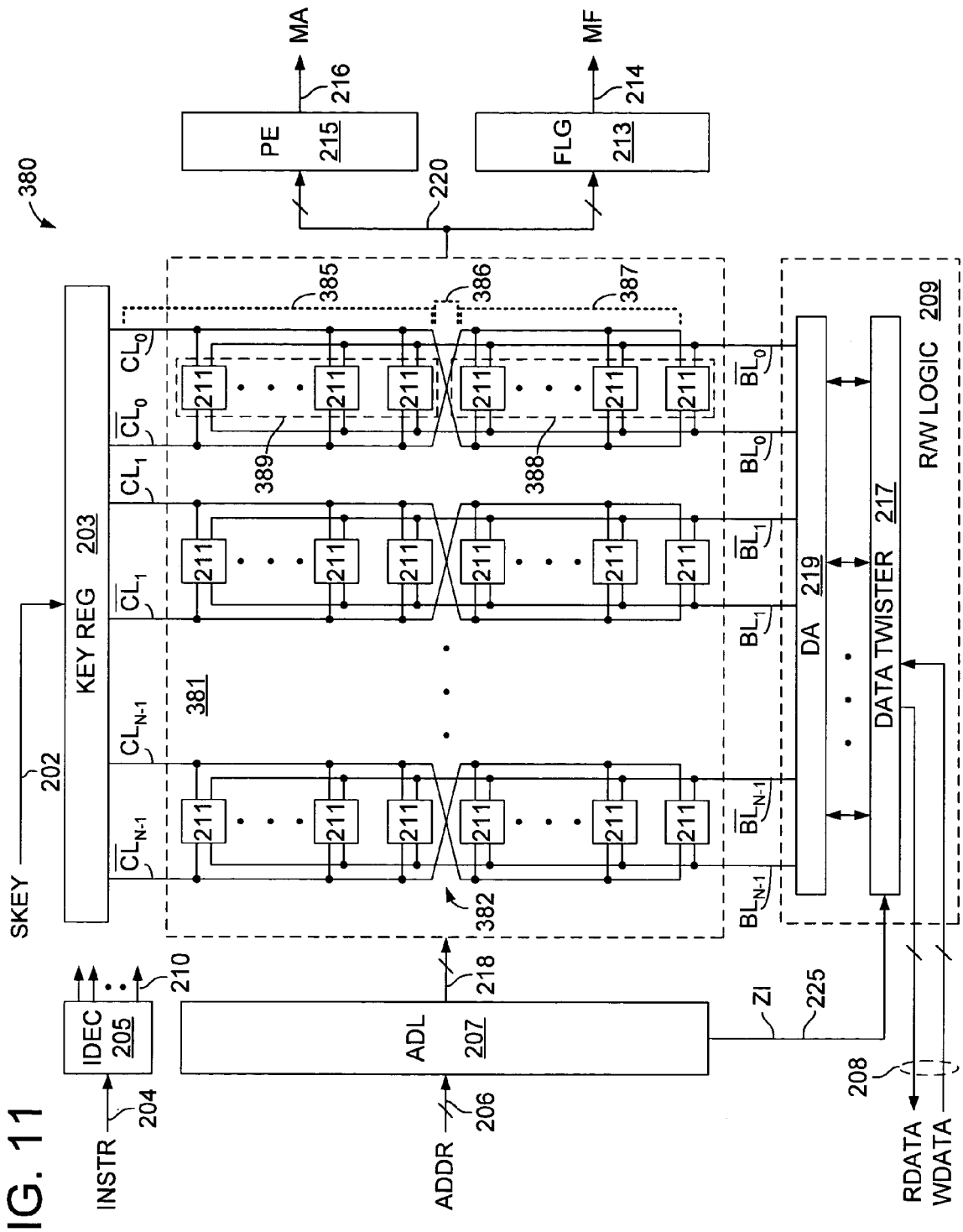
FIG. 11 illustrates a CAM device having a twisted-compare-line CAM array according to an embodiment of the invention.

FIG. 11 illustrates a CAM device 380 having a twisted-compare-line CAM array 381 according to an embodiment of the invention. The CAM device 380 also includes read/write logic ("R/W LOGIC") 209, address logic ("ADL") 207, instruction decoder ("IDEC") 205, key register ("KEY REG") 203, priority encoder ("PE") 215 and flag circuit ("FLG") 213 which interface with signal paths 202, 204, 206 and 208 and which operate generally as described in reference to FIG. 3 to carry out search operations (e.g., generating match address 216 and match flag 214) and to enable read/write access within the CAM array 381. As in the embodiment of FIG. 3, additional circuit blocks may be provided in the CAM device 380 to perform other functions such as error checking, database maintenance, device configuration and so forth.

In the embodiment of FIG. 11, each compare line pair CL, /CL within the CAM array 381 is twisted at a single point along its length as indicated at 382. That is the constituent compare lines of each compare line pair extend, from the compare line driver circuitry within the key register 203, part of the way along the length of a CAM cell column in a first segment 385; turn and cross one another in a second, crossing segment 386; then extend along the remainder of the CAM cell column in a third segment 387. By twisting the compare lines in this manner, each constituent compare line of a compare line pair extends adjacent (and in proximity to) a first bit line of the corresponding bit line pair (BL, /BL) over the first part of the column length, and adjacent (and in proximity to) the second bit line of the bit line pair over the remainder of the column length. Consequently, as shown in FIG. 4, a charging compare line yields a capacitively coupled transient on both bit lines of the corresponding bit line pair. By forming the crossing segments of the compare line pairs at a point along the column length that yields a balanced transient coupling onto both bit lines of the corresponding bit line pairs, the differential amplitude of a signal developed on each bit line pair during a read operation remains substantially unattenuated, thereby avoiding or at least reducing the search-read interference that plagues the prior-art arrangement described in reference to FIG. 1.

As with the twisted bit lines in the embodiment of FIG. 3, the crossing segment 386 of a twisted compare line pair effectively inverts (i.e., twists) the differential comparand signal conducted on the third segment 387 of the compare line pairs and thus divides each column of CAM cells 211

(and therefore the CAM array 381) into separate twist and normal zones 388 and 389, respectively. In a data twisting embodiment, the twist-zone comparand inversion is counteracted by twisting data read from or written to the CAM array 381 in the manner described in reference to FIGS. 3, 6, 7 and 8. Also, various twist zone detect circuits may be used to determine when a data read or write operation is directed to a row of CAM cells in a twist zone; asymmetric twist and normal zones may be formed by off-centered location of the compare line crossing segment; and multiple twist zones may be effected by providing multiple crossing segments in the compare line pairs, such twisted compare line embodiments being analogous to the twisted bit line embodiments of FIGS. 10A-10D. In other embodiments, combinations of bit line crossings and compare line crossings may be used to establish multiple twist zones.

Data Twist Operations in a CAM Device Having Multi-Bit CAM Cells

In a binary CAM embodiment (i.e., no local masking within individual CAM cells), the data twisting operation carried out for the twisted bit line and twisted compare line embodiments may be identical, in both cases complementing data prior to storage in a twist-zone row and complementing data read from a twist-zone row before outputting the data onto an external signal path. In a ternary or quaternary CAM embodiment, however, different twist/untwist operations may be carried out within the read/write logic according to whether a given twist zone is effected by twisted compare lines or twisted bit lines. FIGS. 12 and 13, for example, illustrate a ternary CAM cell 401 disposed in a twist zone and attendant data twisting operations that may be used according to whether data bit lines (BL) and mask bit lines (ML) are twisted to effect the twist zone as indicated at 418, or the compare lines (CL) are twisted to effect the twist zone as indicated at 419. The ternary CAM cell 401 includes a data storage element 403 (D) and mask storage element 405 (M) each having an inverting node (indicated by a negation dot 'o') and a non-inverting node. The inverting and non-inverting nodes of the data storage element 403 are coupled to the data bit lines via pass gates 404 (e.g., MOS transistor switches in the embodiment of FIG. 12), and the inverting and non-inverting nodes of the mask storage element 405 are coupled to the mask bit lines via pass gates 406. Gate terminals of the pass gates 404 and 406 are coupled to word line WL so that the pass gates 404 and 406 are switched to a conducting state when the word line is activated, thereby enabling read and write access to the data and mask storage elements 403 and 405. The ternary CAM cell 401 additionally includes a maskable compare circuit formed by transistors 409, 411, 413, 415 and masking transistor 407. Gate terminals of transistors 413 and 415 are coupled to the compare lines to receive complementary comparand signals therefrom, and gate terminals of transistors 409 and 411 are coupled to the inverting and non-inverting nodes, respectfully, of the data storage element 403 to receive complementary data signals therefrom. The gate terminal of the masking transistor 407 is coupled to the inverting node of the mask storage element 405 to receive a complement mask signal therefrom (i.e., /M). Transistors 413, 409 and 407 are coupled in series between a precharged match line (ML) and ground so that, if all three transistors are switched to a conducting state, the match line is discharged to signal a mismatch condition. Similarly, transistors 415, 411 and 407 are coupled in series between the match line and ground so that, if all switched to a conducting state, the match line is discharged to signal a mismatch condition. In a normal zone CAM cell, the data bit line and mask bit line coupled to the inverting nodes of the data and mask storage elements 403 and 405 are disposed adjacent the compare line used to carry uncomplemented comparand data, while the data bit line and mask bit line coupled to the non-inverting nodes of the data and mask storage elements 403 and 405 are disposed adjacent the compare line used to conduct complement comparand data. Thus, in a normal zone CAM cell, transistors 413 and 409 receive comparand bit C and complement data bit /D; transistors 415 and 411 receive /C and D, and masking transistor 407 receives complement mask bit, /M. Accordingly, if the comparand bit and stored data bit do not match (i.e., C=1, D=0 or C=0, D=1) and the mask bit is not set (M=0), then the match line will be discharged either through transistors 413, 409 and 407 or transistors 415, 411 and 407, thus signaling the mismatch condition. By contrast, if the CAM cell 401 is disposed in a twist zone effected by twisting the mask bit lines and data bit lines, then the data and mask bits presented on the data and mask bit lines during a write operation will be stored in the data and mask storage elements in an inverted state relative to the corresponding bits of the original write data value. That is, as shown in the table of FIG. 13, both the mask and data bits in an incoming write data value (i.e., Input M and D) are complemented to form the twist mask bit (BL-Twist TM) and twist data bit (BL-Twist TD) driven onto the twisted mask and data bit lines in a write operation directed to a twist-zone row. Reverse conversion operations are performed to restore the twist mask and twist data bits to untwisted mask and data bits (M and D) in a read operation directed to a twist-zone row.

If the CAM cell 401 is disposed in a twist zone effected by twisting the compare lines, however, then the data and mask bits presented on the data and mask bit lines in a write operation will be stored in the data and mask storage elements the same state as the corresponding bits of the original write data value. However, due to the comparand bit inversion effected by the compare line twist, the complement and uncomplemented data bit will, absent data twisting, be compared with the complement and uncomplemented comparand bits, respectively, a comparison which will yield a false match or false mismatch indication. Thus, as shown in FIG. 13 (i.e., under heading CL-Twist), the data bit of an incoming write data value is complemented to form the twist data bit (TD) driven onto the data bit lines in a write operation directed to a twist-zone row, but the mask bit of the incoming write data value is driven onto the mask bit lines without being complemented (i.e., TM=M). Reverse conversion operations are performed during a read operation to recover original data and mask bits D and M (i.e., complementing the twist data bit, TD, to recover original data bit D, but passing the twist mask bit without conversion as TM=M).

Still referring to FIG. 12, it should be noted that different circuit configurations may be used to implement the ternary CAM cell 401. For example, transistor 407 may be coupled between the match line and the drain terminals of transistors 413 and 415 instead of between ground and the source terminals of transistors 409 and 411. Also, the mask bit may be used to disable the differential comparand signals from being applied to gate terminals of transistors 413 and 415 (i.e., selectively routing logic-low signals to the gates of transistors 413 and 415 to effect a masking state). Similarly, the mask bit may be used to disable the differential data signals from being applied to gate terminals of transistors 409 and 411. More generally, any circuit configuration that selectively prevents CAM cell 401 from indicating a mismatch condition according to the state of the match bit, M, may be used without departing from the spirit and scope of the present invention.

FIGS. 14 and 15 illustrate a quaternary CAM cell 431 disposed in a twist zone and attendant data twisting operations that may be used according to whether X bit lines (XL) and Y bit lines (YL) are twisted to effect the twist zone as indicated at 448, or the compare lines (CL) are twisted to effect the twist zone as indicated at 449. The quaternary CAM cell 431 includes an X-bit storage element 433 (X) and Y-bit storage element 435 (Y) each having an inverting node (indicated by a negation dot 'o') and a non-inverting node. The inverting and non-inverting nodes of the X-bit storage element 433 are coupled to the X bit lines via pass-gates 434, and the inverting and non-inverting nodes of the Y-bit storage element 435 are coupled to the Y bit lines via pass gates 436. Gate terminals of pass gates 434 and 436 are coupled to word line WL so that pass gates 434 and 436 are switched to a conducting state when the word line is activated, thereby enabling read and write access to the X-bit and Y-bit storage elements 433 and 435. The quaternary CAM cell 431 additionally includes a compare circuit formed by transistors 443, 445, 439 and 441. Gate terminals of transistors 443 and 445 are coupled to the compare lines to receive complementary comparand signals therefrom, and gate terminals of transistors 439 and 441 are coupled to the non-inverting nodes of the X-bit and Y-bit storage elements 433 and 435, respectfully, to receive X and Y data signals therefrom. Transistors 443 and 439 are coupled in series between a precharged match line (ML) and ground so that, if both switched to a conducting state, the match line is discharged to signal a mismatch condition. Similarly, transistors 445 and 441 are coupled in series between the match line and ground so that, if both switched to a conducting state, the match line is discharged to signal a mismatch condition.

FIG. 15 illustrates an exemplary conversion of incoming mask and data bits (Input M and D) to corresponding X and Y bits (i.e., the X and Y bits being shown under the heading "XY Conv"). As shown, when the mask bit is in a non-masking state (i.e., a logic '0' state in this example), the X bit has the same state as the data bit (X=D) and the Y bit is the complement of the data bit (Y=/D). When the mask bit is in a masking state, both the X and Y bits are set to '0'. By this operation, assuming a normal-zone CAM cell, when the masking bit is reset, D and /D are stored within the X-bit and Y-bit storage elements 433 and 435, respectively, so that, in effect, D and /C are supplied respectively to the gate terminals of transistors 439 and 443, and /D and C are supplied respectively to the gate terminals of transistors 441 and 445, thereby enabling the match line to be discharged through one of the two transistor pairs in the event of a mismatch (i.e., through transistors 443 and 439 when C=0 and D=1, or through transistors 445 and 441 when C=1 and D=0). If the masking bit is set, then logic '0' values are stored in both the X-bit and Y-bit storage elements 433 and 435, thereby preventing a path to ground from being formed through transistors pairs 443/439 and 445/441 regardless of the state of the comparand bit (i.e., masking a mismatch condition).

Still referring to FIGS. 14 and 15, if the quaternary CAM cell 431 is disposed in a twist zone effected by twisting the X bit lines and Y bit lines, then the X and Y bits presented on the X bit lines and Y bit lines during a write operation will be stored in the X-bit and Y-bit storage elements 433 and 435 in an inverted state relative to the corresponding X and Y bits of the original X-Y conversion. Accordingly, as shown in the table of FIG. 15 under the heading "BL-Twist," both the X and Y bits (X and Y) that result from an M-D to X-Y conversion are complemented to form the twist X bit (TX) and twist Y bit (TY) driven onto the twisted X bit lines and twisted Y bit lines, respectively, in a write operation directed to a twist-zone row. Reverse conversion operations are performed to restore the twist X and twist Y bits to untwisted X and Y bits in a read operation directed to a twist-zone row. Reverse conversion may also be carried out to restore the untwisted X and Y bits to M and D bits. Direct conversion from M and D to TX and TY and vice-versa may also be performed.

If the quaternary CAM cell 431 is disposed in a twist zone effected by twisting the compare lines, then the X and Y bits presented on the X bit lines and Y bit lines in a write operation will be stored in the X-bit and Y-bit storage elements 433 and 435 in the same state as the corresponding bits of the original M-D to X-Y conversion. However, assuming that a non-masked value is stored (i.e., Y=/X), then the comparand bit inversion effected by the compare line twist will, absent data twisting, cause the complement and uncomplemented comparand bits to be compared with the complement and uncomplemented data bits. That is, C will be compared with X (X=D) and /C will be compared with Y (Y=/D), a comparison which will yield a false match or false mismatch indication. By contrast, if a masking state is stored in the quaternary CAM cell (i.e., X=Y='0'), the CAM cell will function properly, indicating a match condition regardless of the comparand state. Thus, as shown in FIG. 15 under heading "CL-Twist," if a non-masking value is to be stored within the quaternary, twist-zone CAM cell 431, the X bit and Y bit resulting from an M-D to X-Y conversion are complemented to form the twist X bit (TX) and twist Y bit (TY) driven onto the X bit lines and Y bit lines, respectively. If a masking value is to be stored within the twist-zone CAM cell, the X bit and Y bit resulting from the M-D to X-Y conversion are driven without change onto the X bit lines and Y bit lines, thereby effecting storage of logic '0' values in both the X-bit and Y-bit storage elements 433 and 435. As in the twisted X and Y bit line embodiment, reverse conversion operations are performed to restore the twist X and twist Y bits to untwisted X and Y bits in a read operation directed to a twist-zone row. Reverse conversion may also be carried out to restore the untwisted X and Y bits to M and D bits. Direct conversion from M and D to TX and TY and vice-versa may also be performed.

Still referring to FIG. 15, it should be noted that the original M-D to X-Y conversion may be performed within a host device so that the incoming write data values are received in X-Y format. Similarly, read data may be output in X-Y format for optional M-D conversion in the host device. More generally, any data conversion operations described herein, including data twisting operations may be performed in a host device or other device or circuitry external to the CAM device.

Row Redundancy

Figure 16:
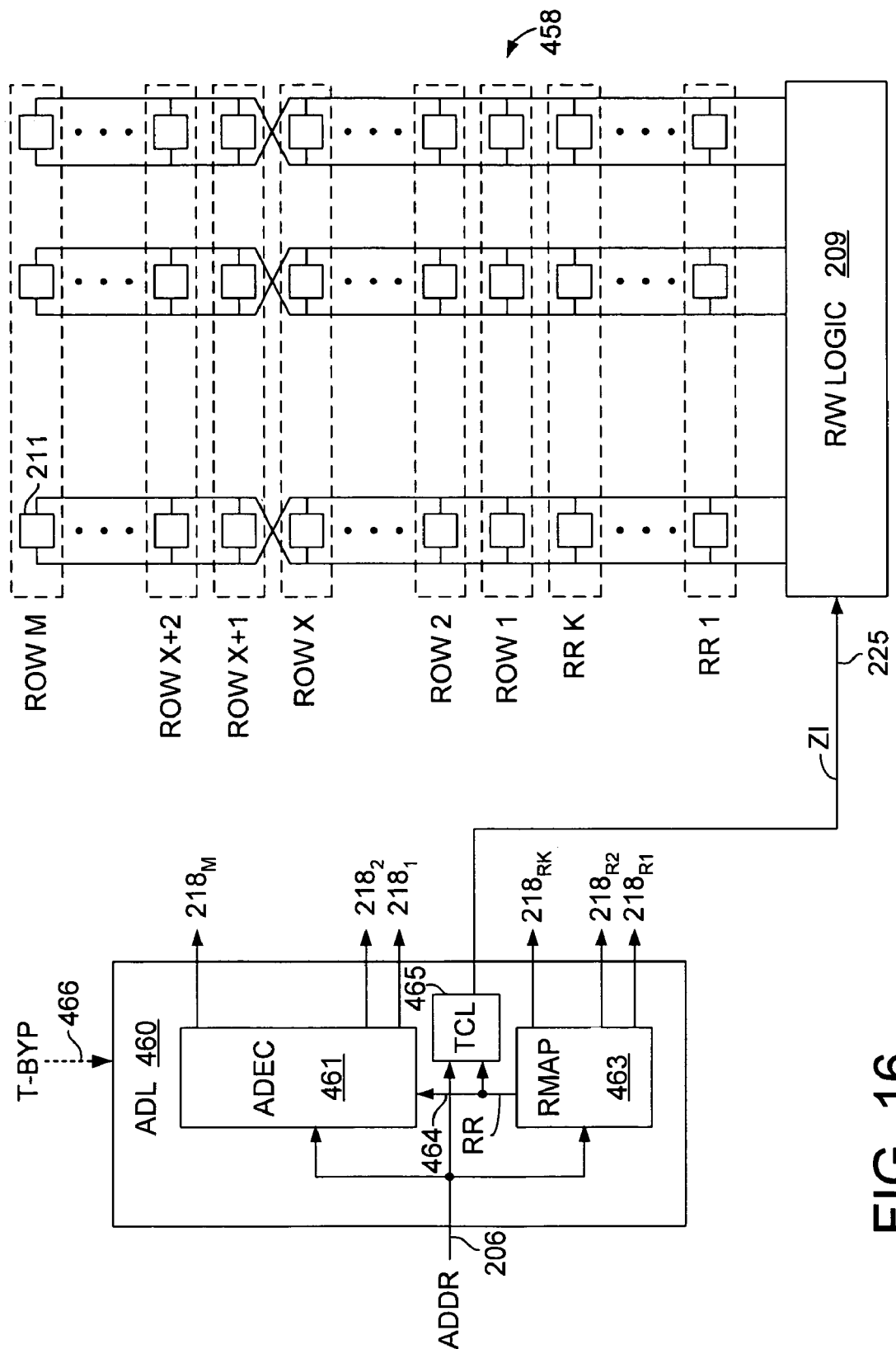
FIG. 16 illustrates a CAM array, address logic and read/write logic that form part of a redundant-row CAM device according to an embodiment of the invention.

FIG. 16 illustrates a CAM array 458, address logic ("ADL") 460 and read/write logic ("R/W LOGIC") 209 that form part of a redundant-row CAM device according to an embodiment of the invention. The CAM array 458 includes primary CAM rows 1 to M as well redundant CAM rows 1 to K, K being an integer value greater than or equal to one (1). The redundant CAM rows are spare rows that may be used in place of primary rows that have been disqualified, for example, due to defects or out-of-tolerance operation. When a primary row is disqualified (e.g., as a result of wafer probing or other production-time testing) the address of the disqualified row is recorded in a redundancy map 463 within the address logic 460 (e.g., using fused circuits, one-time programmable registers, or other non-volatile configuration circuitry) and associated with an unused one of the redundant rows. Incoming addresses ADDR (or addresses obtained from internal registers within the CAM array) are supplied via path 206 to the redundancy map ("RMAP") 463 and to address decoder ("ADEC") 461 and twist control logic ("TCL") 465. The redundancy map 463 determines whether the address matches an address associated with a redundant row and, if so, asserts a redundant row signal 464 (RR) and activates one of redundant row word lines $218_{R1}$-$218_{RK}$ to enable access to the indicated redundant row (i.e., the selected redundant row). The redundant row signal 464 is supplied to the address decoder 461 and the twist control logic 465 and, when asserted, disables word line activation within the address decoder 461 (which otherwise activates one of word lines $218_1$-$218_M$ in accordance with the address) and causes the twist control logic 465 to output the zone indicator ("ZI") 225 in a state that corresponds to the zone containing the selected redundant row. That is, if the selected redundant row is disposed in a normal zone, then the zone indicator 225 is deasserted to prevent data twisting within the read/write logic 209. Conversely, if the selected redundant row is disposed in a twist zone, the zone indicator 225 is asserted to enable data twisting. When the redundant row signal 464 is deasserted, the twist control logic 465 generates the zone indicator 225 according to whether the address (or selected bits thereof) indicate an access to a normal-zone row or twist-zone row, A twist-bypass signal ("T-BYP") 466 may optionally be provided to the address logic to disable assertion of the zone indicator 225, thereby preventing (i.e., bypassing) data twisting within the read/write logic 209 for test or other purposes.

In the embodiment of FIG. 16, all the redundant rows are disposed in a normal zone of a twisted bit line CAM array 458. In an alternative embodiment, all the redundant rows may be disposed in a twist zone of the CAM array 458, or some of the redundant rows may be disposed in one or more twist zones while others of the redundant rows are disposed in one or more normal zones. Also, the twist zone(s) and normal zone(s) may alternately be formed by twisted compare lines or a combination of twisted bit lines and compare lines. Further, in the embodiment of FIG. 16, the crossed segment of the bit line pairs (which may alternatively be formed in the compare line pairs) is disposed between rows X/2 and X/2+1. The value of X may be chosen to balance the capacitive coupling between compare lines and bit lines as discussed above, and may be offset from the value M/2 according to the number of redundant rows, K. For example, in the embodiment of FIG. 16 in which each of the K redundant rows is disposed in the normal zone, (M−K)/2 may be chosen as the value of X to equalize the total number of rows in the twist and normal zones. Other values of X may be used in alternative embodiments.

Figure 17:
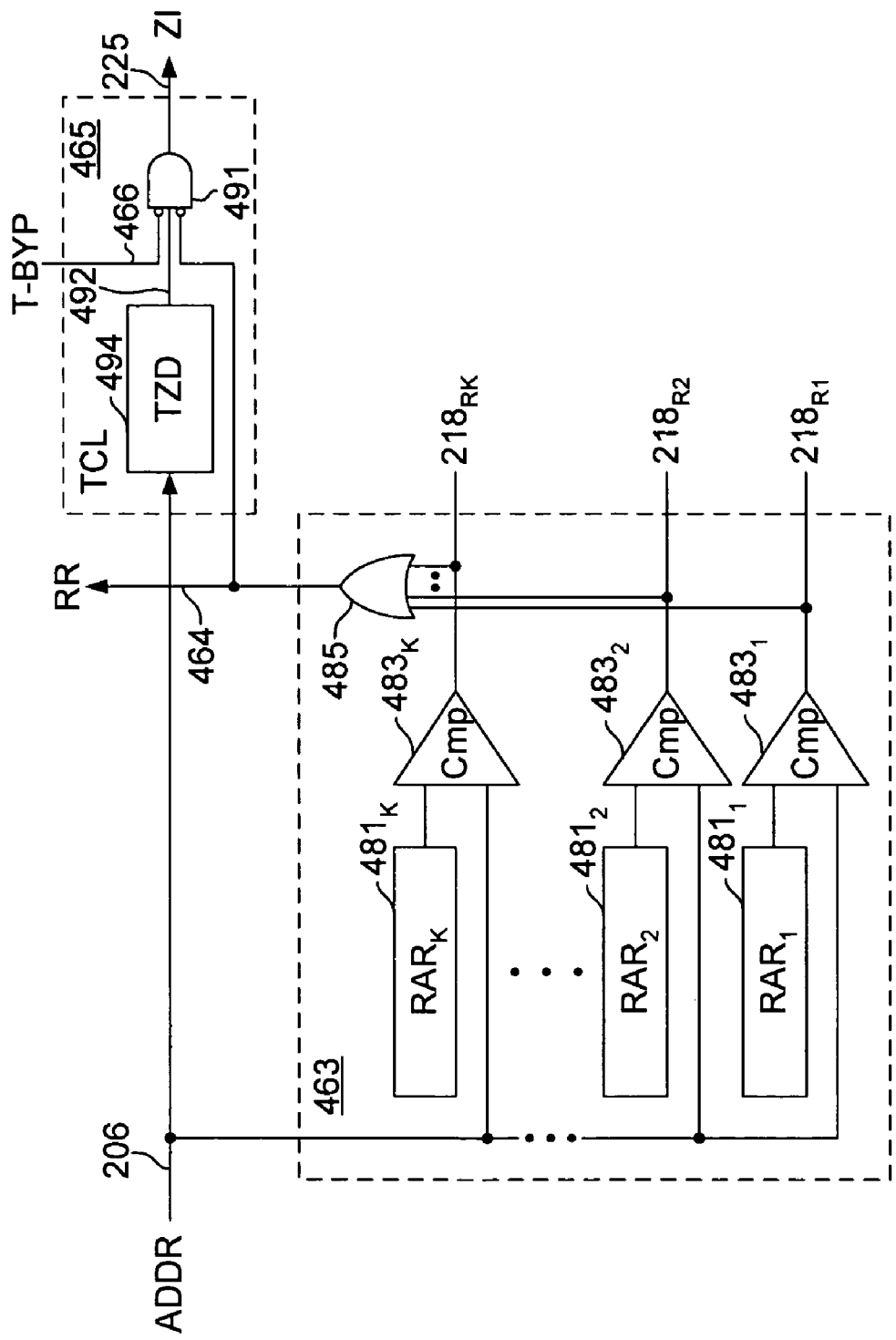
FIG. 17 illustrates a more detailed embodiment of the redundancy map and twist control logic of FIG. 16.

FIG. 17 illustrates amore detailed embodiment of the redundancy map 463 and twist control logic 465 of FIG. 16. The redundancy map 463 includes redundancy address registers ("RAR") $481_1$-$481_K$ (e.g., programmable, non-volatile storage circuits) each of which may be programmed with the address of a disqualified primary CAM row, and also includes comparators ("Cmp") $483_1$-$483_K$ each coupled to receive an address value, if programmed, from a corresponding redundancy address register 481. Each of the comparators 483 is also coupled to receive a read/write address (ADDR) via path 206 and includes circuitry to determine whether the read/write address matches the address from the corresponding redundancy address register 281. The outputs of the comparators $483_1$-$483_K$ are coupled to respective redundant-row word lines $218_{R1}$-$218_{RK}$ (thereby associating each redundant row with the redundancy address, if any, programmed within the corresponding redundancy address register). By this arrangement, if the read/write address matches an address programmed within any of the redundancy address registers $481_1$-$481_K$, the comparator 483 coupled to the address-matching register 481 asserts the corresponding redundant-row word line to carry out the redundant row selection. The outputs of the comparators $483_1$-$483_K$ are additionally coupled to inputs of logic OR gate 485 which therefore asserts or deasserts the redundant row signal 464 (RR) according to whether a redundant row has been selected for access (i.e., according to whether the read/write address matches the address associated with a redundant row).

The twist control logic ("TCL") 465 includes a twist zone detect circuit ("TZD") 494 which may be implemented by any of the above-described twist zone detect circuits or any other circuit for determining whether the read/write address falls within a twist zone and, if so, asserting a twist-zone detect signal 492 to a non-inverting input of logic AND gate 491. In an alternative embodiment, the twist zone detect circuit 494 may be omitted and one or more of the address bits passed through to respective inverting and/or non-inverting inputs of the AND gate 491. A first inverting input of the logic AND 491 is coupled to receive the redundant row signal 464 and a second inverting input of the logic AND gate 491 is coupled to receive the twist-bypass signal ("T-BYP") 496. By this arrangement, if a redundant row is selected for access (i.e., redundant row signal 464 asserted), the logic AND gate 491 outputs a logic low zone indicator 225 to indicate a normal zone access. If the redundant rows are located in a twist zone, then the redundant row signal 464 may be logically ORed with the twist-zone detect signal 492 to form the zone indicator 225. Also, if the redundant rows are disposed in both twist and normal zones, appropriate logic may be provided within the twist control logic 465 to assert or deassert the zone indicator 225 according to which of the redundant rows is selected for access. If the twist-bypass signal 466 is deasserted, the zone indicator 225 is asserted according to the states of the twist zone detect signal 492 and redundant row indicator 464 (i.e., ANDed or ORed combination, as discussed above). If the twist-bypass signal 466 is asserted, for example during write-and-readback testing of the CAM array, the zone indicator 225 is deasserted, regardless of whether the row being accessed is a normal-zone row or twist-zone row. In alternative embodiments, the twist-bypass signal 466 and corresponding input to logic AND gate 491 may be omitted.

Mixed-Cell CAM Array

In mixed-cell embodiments of the invention, CAM cells in the twist zone are configured differently than normal-zone CAM cells to counteract the twisted-data-line-induced signal inversion, thereby obviating twist zone detection in the address logic and data twisting circuitry within the read/write logic.

Figure 18:
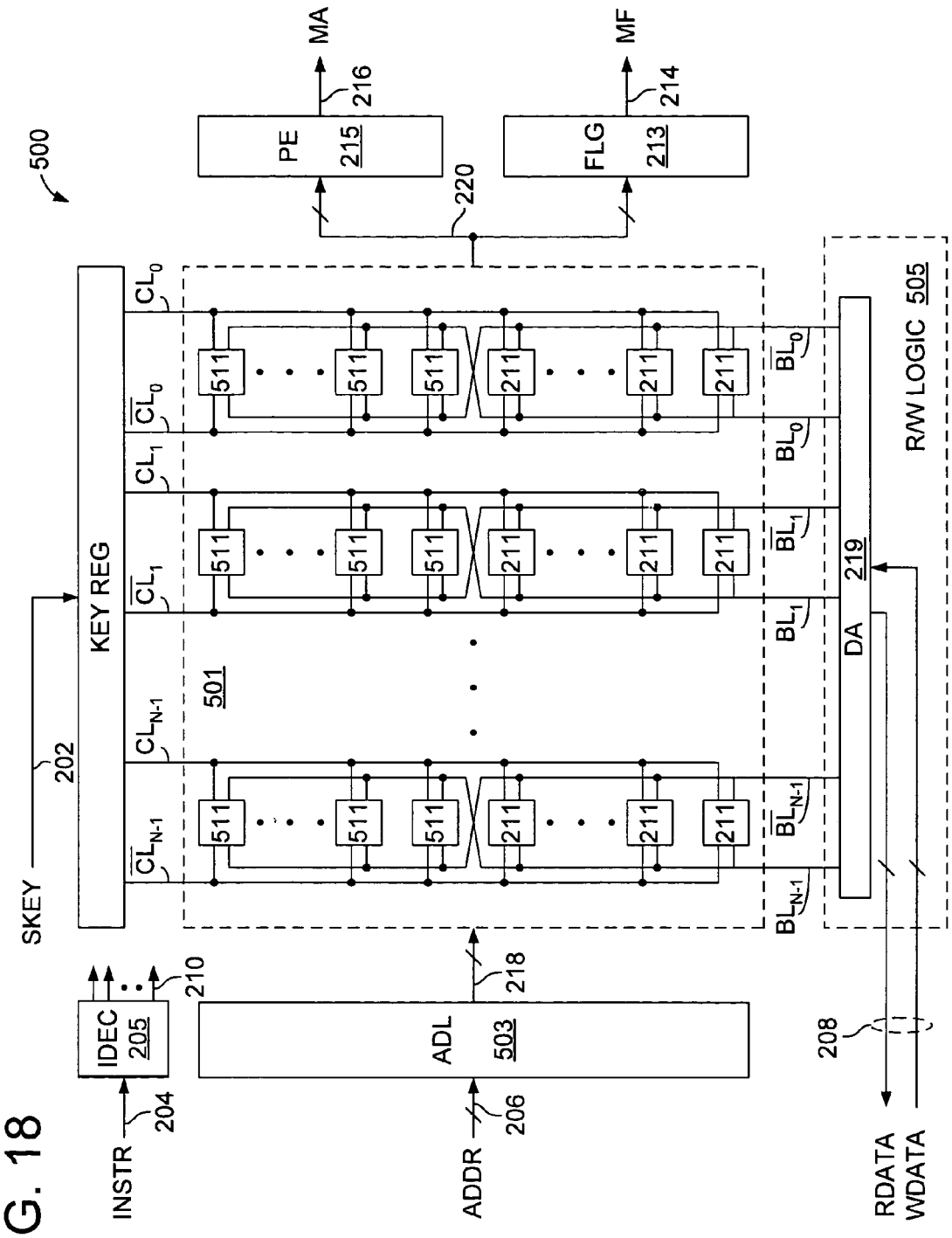
FIG. 18 illustrates a CAM device having a mixed-cell CAM array according to an embodiment of the invention.
Figure 19C:
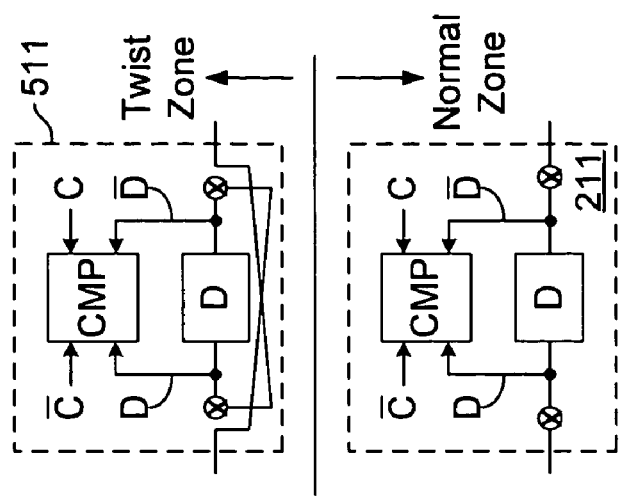
FIGS. 19A, 19B and 19C illustrate different coupling arrangements that may be used to implement twist-zone CAM cells in the mixed-cell CAM array of FIG. 18.
Figure 19B:
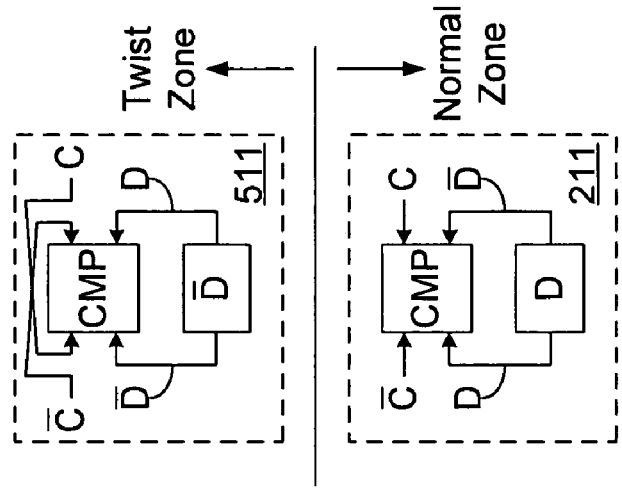
Figure 19A:
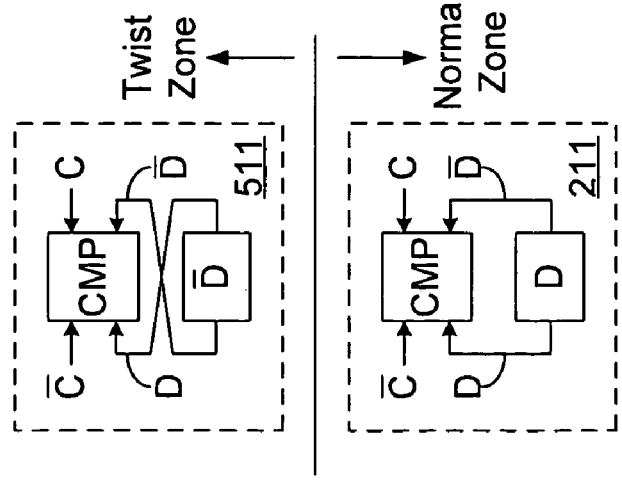

FIG. 18 illustrates a CAM device 500 having a mixed-cell CAM array 501 according to an embodiment of the invention. The CAM device 500 also includes read/write logic ("R/W LOGIC") 505, address logic ("ADL") 503, instruction decoder ("IDEC") 205, key register ("KEY REG") 203, priority encoder ("PE") 211 and flag circuit ("FLG") 213 which interface with signal paths 202, 204, 206 and 208 and which operate generally as described in reference to FIG. 3 to carry out search operations and to enable read/write access within the CAM array 501. Because of the mixed-cell CAM array 501, however, circuitry within the address logic 503 and read/write logic 505 for performing selective data twisting is omitted (i.e., no zone indicator signal need be generated by the address logic 503 and the data twister may be omitted from the read/write logic 505). More specifically, twist-zone CAM cells 511 are configured differently from normal-zone CAM cells 211 to counteract the effect of the data line twist, for example, by cross-coupling the outputs of the data storage element to the compare circuit as shown in FIG. 19A, by cross-coupling the comparand signal inputs to the compare circuit as shown in FIG. 19B, or by cross coupling the bit line connections to the data storage element as shown in FIG. 19C. In the case of a ternary CAM cell coupled to twisted mask and data bit lines, the proper state of the masking bit may be established in twist-zone CAM cells 511 by coupling the non-inverting node of the mask storage element to the masking transistor (or transistors), or by cross-coupling the mask bit line connections to the mask storage element. Similarly, in the case of a quaternary CAM cell 511 disposed in the twist zone of mixed-cell CAM array 501, the inverting outputs of the X-bit and Y-bit storage elements may be coupled to the compare circuit instead of the non-inverting outputs, or the X bit lines may be cross-coupled to the inverting and non-inverting nodes of the X-bit storage element and the Y bit lines cross-coupled to the inverting and non-inverting nodes of the Y-bit storage elements. In the case of a twisted-compare line CAM array having ternary CAM cells, the CAM cells 511 in the twist-zone may have crossed data bit line (but not mask bit line) connections to the inverting and non-inverting nodes of the data bit storage element; crossed data storage element connections to the compare circuit; or crossed compare line connections to the compare circuit. In the case of a twisted compare line CAM array having quaternary CAM cells, the CAM cells 511 in the twist-zone may have crossed X and Y connections to the compare circuit (i.e., the output of the X-bit storage element being coupled to the transistor otherwise coupled to the Y-bit storage element, and vice-versa), or crossed compare line connections to the compare circuit.

Data Line Crossing—Physical Arrangement

FIGS. 20A and 20B illustrate a perspective view and profile view of a data line crossing arrangement according to an embodiment of the invention. Referring first to FIG. 20A, a pair of data lines 540 and 550 are formed in a first and second conductive layers of a multi-layer integrated circuit device (e.g., metal layers i and j, where i and j each represent an arbitrary one of Q metal layers of the integrated circuit device). A first segment 541 of data line 540 extends to a crossing region 548 then turns to form a crossing segment 542 (i.e., segment 541 bends forming an interior angle less than 180 degrees). The crossing segment 542 extends through the crossing region 548, then turns to form a third segment 543 that extends from the crossing region 548 in a direction parallel to the first segment 541. In one embodiment, all the segments of the data line 540 (i.e., 541, 542, 543) are formed in the same conductive plane and therefore may be formed by a continuous conductive trace in the first conductive layer.

A first segment 551 of data line 550 extends in the first conductive layer parallel to the first segment of data line 541 until it reaches the crossing region 548. At the crossing region 548, the first segment 541 is coupled to a conductive overpass 549 (or underpass) that passes over (or under) the crossing segment 542 of data line 540. The conductive overpass/underpass 549 constitutes a second segment of the data line 550 and includes a first inter-layer connection element 552, crossing segment 554 formed in a second conductive layer, and second inter-layer connection element 556 that are coupled to one another and extend from the first segment 551 of data line 551 to a third segment 553 of data line 550. The crossing segment 542 of data line 540 and conductive overpass/underpass 549 of data line 550 are arranged such that the third data segment 553 of data line 550 is substantially axially aligned with the first segment 541 of data line 540 and the third segment 543 of data line 540 is substantially axially aligned with the first segment 551 of data line 550. As discussed above, the data line pair may be bit lines or compare lines. In the case of crossings between multiple pairs of bit lines in a single column of CAM cells (e.g., where mask bit lines and data bit lines, or X bit lines and Y bit lines are provided for each column of CAM cells), the crossing region of each bit line pair of bit lines may be offset from one another such that both bit lines may cross in two conductive layers of the integrated circuit device. Alternatively, the crossing segment in a conductive overpass/underpass for one bit line pair may be disposed in the second conductive layer, while the crossing segment in a conductive overapass/underpass for the other bit line pair is disposed in a third conductive layer. In the latter case, the inter-layer connection elements may extend from the first conductive layer to the third conductive layer, or may include multiple connection elements to achieve the first layer-to-third layer connection.

In embodiments having multiple crossings in each pair of data lines (e.g., as shown in FIGS. 10B, 10C, 10D), conductive overpass/underpass structures may be formed alternately in each of the data lines (e.g., half or approximately half of the conductive overpass/underpass structures formed in each data line of a given pair). Alternatively, or where there is only one or a small number of data line crossings, a dummy structure may be provided in the single-layer data line (i.e., the data line otherwise formed without an inter-layer connection element) to equalize the electrical lengths or other characteristics of the individual data lines of each data line pair.

FIG. 20B illustrates a profile view of the conductive overpass 549 of FIG. 20A according to an embodiment of the invention. The first segment 551 of data line 550 is formed in a first conductive layer (Z) and is coupled, through a conductive via 562 (i.e., one form of an inter-layer connection element) formed in a dielectric layer (Dielectric), to a crossing segment 554 formed in a second conductive layer (Z+1). The crossing segment 554 extends over the crossing segment 542 of data line 540 to a second conductive via 566 that joins the crossing segment 554 to the third segment 553 of the data line 550.

Multi-Block CAM Device with Twisted-Data-Line CAM Arrays

Figure 21:
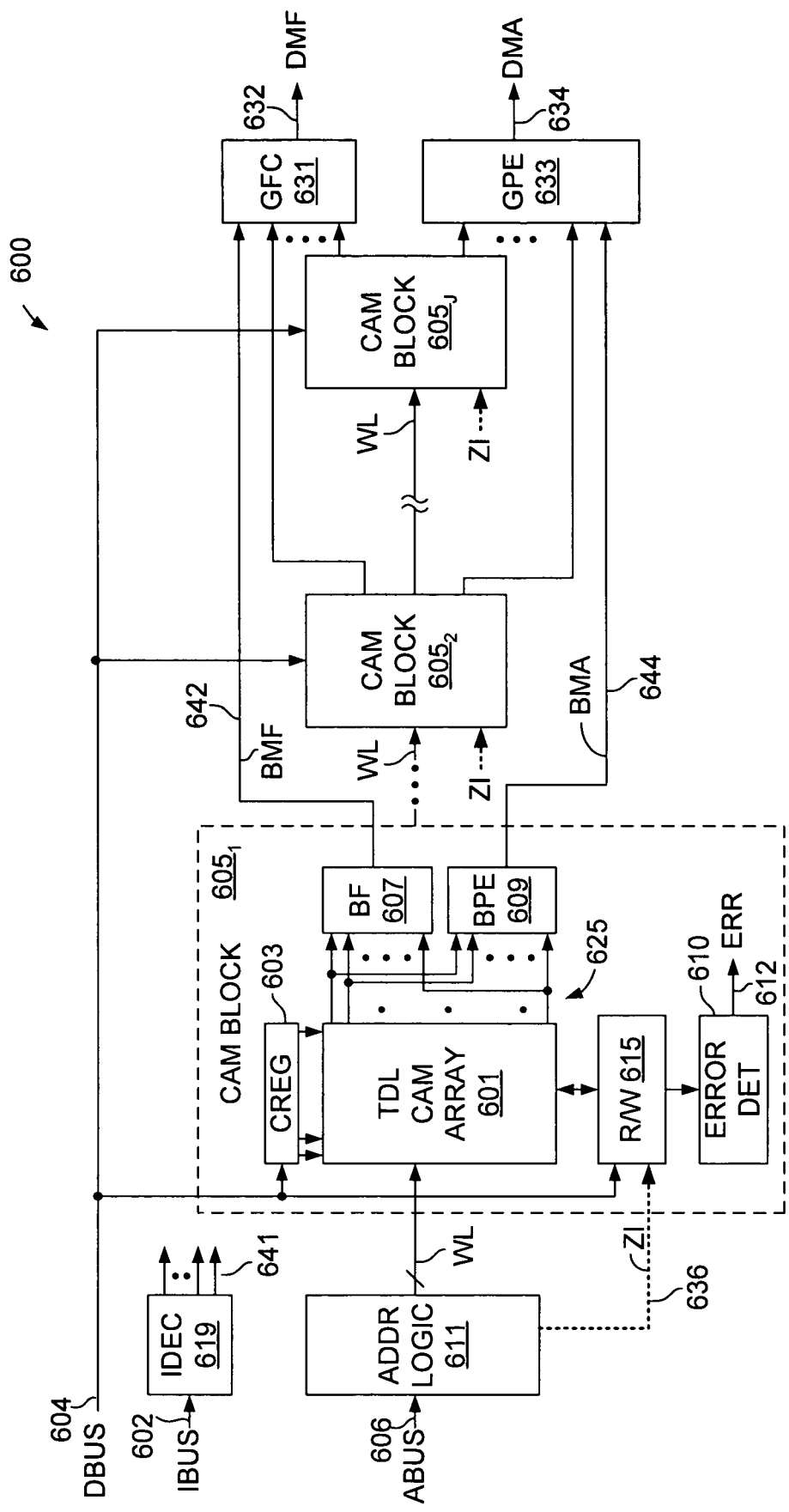
FIG. 21 illustrates a CAM device according to an embodiment of the invention.

FIG. 21 illustrates a CAM device 600 according to an embodiment of the invention. The CAM device 600 may be implemented in a dedicated integrated circuit (IC) device or as a portion of an IC device (or IC package) that includes other circuit blocks or features, such as a general or special purpose processor (e.g., network processor or digital signal processor), microcontroller, memory controller, and so forth. In the embodiment of FIG. 21, the CAM device 600 includes multiple independently selectable CAM blocks, $605_1$-$605_J$, instruction decoder ("IDEC") 619, address logic ("ADL") 611, global flag circuit ("GFC") 631 and global priority encoder ("GPE") 633. A number of other circuit blocks, not shown, may also be included within the CAM device 600 including, without limitation, input/output drivers, status registers, configuration circuits, associated storage, and so forth. As shown in the detail view of CAM block $605_1$, each of the CAM blocks $605_1$-$605_J$ includes a twisted-data-line ("TDL") CAM array 601, block flag circuit ("BF") 607 and block priority encoder ("BPE") 609, and read/write circuitry ("R/W") 615. The twisted-data-line CAM array 601 may include twisted bit lines and/or twisted compare lines according to any of the embodiments described above in reference to FIGS. 3-20 and, in a mixed-cell embodiment, may include differently configured CAM cells in normal and twist zones. In a data twisting embodiment, the read/write logic 615 may include data twisting circuitry and the address logic 601 may include zone detection circuitry (and/or twist control logic) to generate a zone indicator 636 (ZI) according to the various embodiments described above.

Instructions such as read, write and search instructions are issued to the CAM device 600 by a host processor, network processor or other control device (not shown) via an instruction bus ("IBUS") 602. In the case of read and write instructions, the control device may additionally issue address values to the CAM device 600 via address bus ("ABUS")) 606 to specify storage locations to be accessed in the CAM array 601. The instruction decoder ("IDEC") 619 responds to instructions received via the instruction bus 602 by signaling other circuit blocks within the CAM device 600 to perform the instructed operation, including issuing control signals 641 to control the data access operations and search operations described in reference to FIGS. 3-20. The address logic 611 receives addresses from the address bus 606 as well as from address sources within the CAM device 600 including, without limitation, a next free address (NFA) register that indicates a highest priority, unoccupied location within a CAM array; a highest priority match (HPM) register that contains a match address generated after a search operation within the CAM device 600; an error check register that contains an address of a storage location within a given CAM array (or all the CAM arrays) to be error-checked (e.g., for parity error, cyclic redundancy check error, error correction code error, or other error); and any other desirable source of addresses. During a read or write access to a CAM array 601 within one of CAM blocks 605, which may be performed concurrently with search operations within the same or different CAM blocks, the address source is selected by the address logic 611 in response to one or more control signals 641 from the instruction decoder 619 (or other control circuitry), and decoded by the address logic 611 to activate a word line (or combination of group and row word lines as in FIG. 11) that corresponds to a selected row of CAM cells within the CAM array 601. As discussed in reference to FIGS. 16 and 17, the selected row of CAM cells may be a redundant row. Read and write operations are carried out in the selected row in the manner described above in reference to FIGS. 3-18. In one embodiment, a host requested read operation is executed by activating an address-selected word line (or combination of group and row word lines) that extends across the CAM arrays 601 in all or a portion of the CAM blocks $605_1$-$605_J$. A block address field of the address is used to enable the sense amplifier circuits within one of the CAM blocks (i.e., within the read/write circuit 615), thereby resolving the overall read operation to a particular row of CAM cells (or portion thereof) within a particular CAM block 605. During an error checking operation, the sense amplifiers within all the CAM blocks $605_1$-$605_J$ (i.e., within the read/write circuits 615) may be enabled concurrently (i.e., at least partly overlapping in time) to enable CAM words, mask words and corresponding error check values to be read from the same row location within each CAM array 601 in each CAM block 605, and checked for error in a respective error detection circuit 610. Because search-read interference is substantially mitigated by the balanced transient coupling onto bit lines of the CAM array, such error checking operations may be carried out without delaying for transient setting, and without interrupting (or interfering with) the stream of search operations executed within the CAM device 600.

In one embodiment, the error detection circuit 610 includes a parity checking circuit that generates one or more parity bits based on the content of the CAM word (or mask word) read from the CAM array 601, then compares the generated parity bits to parity bits read from the CAM array 601 along with the CAM word under test. If the generated parity bits do not match the stored parity bits, the error may be signaled by assertion of an error signal 612 (ERR) and/or by recording an error status in a status register (not shown) of the CAM device 600. The address from which the CAM word in error was read may be stored in a register for later access by the host processor, network processor or other control device. The error detection circuit 610 may perform a parity error check, cyclic redundancy check, checksum check, syndrome check (e.g., a syndrome generated from an error correction code) or any other type of error checking operation.

In the embodiment of FIG. 21, each of the CAM blocks $605_1$-$605_J$ includes a comparand register ("CRG") 603 to store a comparand value received via a data bus ("DBUS") 604, and drive the comparand value onto the compare lines of the corresponding CAM array 601. Alternatively, the comparand register 603 may be omitted and the comparand value driven directly from the data bus 604 onto the compare lines. Comparand registers 603 within the different CAM blocks 605 may be loaded with the same or different comparand values and may be enabled to drive the comparand values onto the compare lines of the corresponding CAM arrays 601 simultaneously, or in pipelined fashion. Within each CAM block 605, compare results generated within the CAM array 601 is output on match lines 625 to the block flag circuit BF 607 and block priority encoder BPE 609. The block flag circuit 607 outputs a block match flag signal 642 (BMF) to indicate whether a match has been detected in the CAM array 601, and may additionally output a multiple match flag signal (not shown) to indicate whether multiple matches have been detected. The block priority encoder 609 outputs a block match address 644 (BMA) that corresponds to the CAM array location containing the highest priority CAM word determined to match the comparand value (CAM word priority may be programmable or fixed in different embodiments). The block match flags 642 from each of the CAM blocks $605_1$-$605_J$ are input to a global flag circuit 631 which generates a device match flag signal 632 (DMF) according to whether any matches were detected in the CAM device 600. As with the block flag circuit 607, the global flag circuit 631 may also output a device multiple match flag signal to indicate whether multiple matches were detected in the CAM device 600. The block match addresses 644 generated by the CAM blocks $605_1$-$605_J$ are input to a global priority encoder 633 which determines a highest priority one of the block match addresses 644 and outputs a corresponding device match address 634 (DMA). The device match address 634 includes the highest priority one of the block match addresses 644 together with a block address segment that identifies the CAM block 605 that sourced the highest priority block match address. In one embodiment, the block priority encoder 609 within each CAM block 605 outputs a predetermined "no-match" code when none of the match signals 625 is asserted. The global priority encoder 633, in turn, treats the no-match code as having a lowest of all possible priorities, so that a match detected within any of the CAM blocks will result in selection of the corresponding block match address over the no-match code. In an alternative embodiment, the block match flags 642 are provided to the global priority encoder 633 along with the block match addresses 644. If a block match flag 642 is deasserted (i.e., to indicate that no match was detected within the corresponding CAM block 605), then the block match address 644 from the same CAM block 605 is disqualified as a source of the block match address portion of the device match address 634.

In one embodiment, each device match address 634 (or each device match address for which the corresponding device match flag 632 is asserted) is supplied to the address logic 611 and used to read the corresponding CAM word from the indicated storage location (i.e., from a specified row of the CAM array 601 within a specified one of CAM blocks $605_1$-$605_J$) for error checking purposes. If an error is detected by the error detection circuit 610, then a qualifying error signal 612 is output from the CAM device 600 along with the device index 634, to inform the host processor, network processor or other control device that the device index (i.e., the match address) resulted from a match with a corrupted CAM word. Although output latency is increased by such error checking, the error checking operation may be executed concurrently with a subsequent search operation, so that search and error checking operations are effectively pipelined to maintain the search throughput of the CAM device.

Although CAM device 600 includes multiple CAM blocks 605, this is not required. In alternative embodiments, a CAM device having a single CAM block may include the twisted data line arrangements described in reference to FIGS. 3-20. Also, in one embodiment, the data bus 604 is used to transmit write and read data to and from the CAM device 600 (i.e., in addition to delivering comparand values) and is therefore coupled to the read/write circuit 615 within each CAM block 605. In alternative embodiments, one or more of the address, instruction and data buses (606, 602, 604) may be eliminated and the corresponding signals time multiplexed onto the remaining bus or buses.

The section headings provided in this detailed description are for convenience of reference only, and in no way define, limit, construe or describe the scope or extent of such sections. Also, while the invention has been described with reference to specific embodiments thereof, it will be evident that various modifications and changes may be made thereto without departing from the broader spirit and scope of the invention. The specification and drawings are, accordingly, to be regarded in an illustrative rather than restrictive sense.

What is claimed is:

1. A content addressable memory (CAM) device comprising:
   a CAM array having a plurality of CAM cells that are arranged in rows and columns, and that are all identically oriented;
   first data line pairs that extend along respective columns of the CAM cells; and
   second data line pairs that extend along respective columns of the CAM cells adjacent the first data line pairs, each second data line pair having first and second constituent data lines that cross one another at a point along their lengths.

2. The CAM device of claim 1 wherein the second data line pairs are compare line pairs.

3. The CAM device of claim 2 wherein the first data line pairs are bit line pairs.

4. The CAM device of claim 1 wherein the second data line pairs are bit line pairs.

5. The CAM device of claim 4 wherein the first data line pairs are compare line pairs.

6. The CAM device of claim 1 wherein substantially equal numbers of rows of the CAM cells are disposed on either side of the point at which the first and second constituent data lines cross one another.

7. The CAM device of claim 1 further comprising third data line pairs that extend along respective columns of the CAM array adjacent the first and second data line pairs.

8. The CAM device of claim 7 wherein the CAM cells within each column include respective first storage elements coupled to a corresponding one of the second data line pairs and respective second storage elements coupled to a corresponding one of the third data line pairs.

9. The CAM device of claim 8 wherein each of the third data line pairs comprises first and second constituent data lines that cross one another at a point along their lengths.

10. The CAM device of claim 7 wherein the CAM cells within each column include respective first storage elements coupled to a corresponding one of the first data line pairs and respective second storage elements coupled to a corresponding one of the third data line pairs.

11. A content addressable memory (CAM) device comprising:
    detection circuitry to determine whether an address to be used in a data access operation within the CAM device falls within a predetermined range of addresses; and
    conversion circuitry to convert a data value received during the data access operation from a first format to a second format if the address falls within the predetermined range.

12. The CAM device of claim 11 wherein the data access operation is a write operation and the data value is a write data value received from a source external to the CAM device.

13. The CAM device of claim 11 further comprising a CAM array and wherein the data access operation is a read operation and the conversion circuitry is coupled to receive the data value from the CAM array.

14. The CAM device of claim 11 wherein the detection circuitry comprises circuitry to determine if a portion of the address is in a first state and to generate a signal indicating that the address falls within the predetermined range of addresses if the portion of the address is in the first state.

15. The CAM device of claim 14 wherein the portion of the address comprises the most significant bit of the address.

16. The CAM device of claim 14 wherein the portion of the address comprises at least two of the most significant bits of the address.

17. The CAM device of claim 14 wherein the portion of the address comprises the least significant bit of the address.

18. The CAM device of claim 11 wherein the detection circuitry comprises compare circuitry to determine if the address exceeds a threshold value and to generate a signal indicating that the address falls within the predetermined range of addresses based, at least in part, on whether the address exceeds the threshold value.

19. The CAM device of claim 18 wherein the compare circuitry comprises a comparator to generate the signal in a first state if the address exceeds the threshold value and in a second state if the threshold value exceeds the address.

20. The CAM device of claim 11 further comprising:
- a CAM array having a first plurality of rows of CAM cells and at least one redundant row of CAM cells to be used in place of a selected row of the first plurality of rows; and
- wherein the detection circuitry includes circuitry to determine if the address corresponds to the redundant row of CAM cells and to generate a signal indicative of whether the address falls within the predetermined range based, at least in part, on whether addresses the address corresponds to the redundant row of CAM cells.

21. The CAM device of claim 11 wherein the conversion circuitry includes logic to disable conversion of the data value from the first format to the second format in response to assertion of a bypass signal.

22. The CAM device of claim 11 wherein the second format is a complement of the first format.

23. A method of operation within a content addressable memory (CAM) device, the method comprising:
- receiving an address and a write data value;
- converting the write data value from a first format to a second format if the address falls within a first range of addresses; and
- storing the write data value within the CAM device at a location indicated by the address.

24. The method of claim 23 wherein converting the write data value from a first format to a second format if the address falls within a first range of addresses comprises converting the write data value from the first format to the second format if a selected set of one or more bits of the address are in a predetermined state.

25. The method of claim 24 wherein the selected set of bits comprises the most significant bit of the address.

26. The method of claim 23 wherein converting the write data value from a first format to a second format if the address falls within a first range of addresses comprises comparing the address with a threshold value to determine whether the address falls within the first range of addresses.

27. The method of claim 23 wherein converting the write data value from a first format to a second format if the address falls within a first range of addresses comprises converting the write data value from the first format to the second format according to whether the address corresponds to a redundant row of CAM cells within a CAM array of the CAM device.

28. The method of claim 23 wherein converting the write data value from a first format to a second format comprises complementing constituent data bits of the write data value.

29. The method of claim 28 wherein converting the write data value from the first format to the second format further comprises complementing constituent mask bits of the write data value.

30. The method of claim 23 wherein converting the write data value from a first format to a second format comprises converting mask and data bits of the write value into X and Y bits of a quaternary value according to first logical expression, the method further comprising converting the mask and data bits of the write data value into X and Y bits of a quaternary value according to a second logical expression if the address falls within a second range of addresses.

31. The method of claim 23 wherein storing the write data value within the CAM device comprises storing the write data value within the CAM device after converting the write data value from the first format to the second format, if the address falls within the first range of addresses.

32. A content addressable memory (CAM) device comprising:
- means for receiving an address and a write data value;
- means for determining whether the address falls within a first range of addresses;
- means for converting the write data value from a first format to a second format if the address falls within a first range of addresses; and
- means for storing the write data value within the CAM device at a location indicated by the address.

* * * * *

UNITED STATES PATENT AND TRADEMARK OFFICE
CERTIFICATE OF CORRECTION

PATENT NO. : 7,319,602 B1
APPLICATION NO. : 10/883158
DATED : July 1, 2008
INVENTOR(S) : Varadarajan Srinvasan et al.

It is certified that error appears in the above-identified patent and that said Letters Patent is hereby corrected as shown below:

In the Claims:

Claim 20, column 27, line 10, change "whether addresses the address" to --whether the address--.

Signed and Sealed this

Twenty-fourth Day of June, 2008

JON W. DUDAS
*Director of the United States Patent and Trademark Office*

UNITED STATES PATENT AND TRADEMARK OFFICE
CERTIFICATE OF CORRECTION

PATENT NO. : 7,319,602 B1  Page 1 of 1
APPLICATION NO. : 10/883158
DATED : January 15, 2008
INVENTOR(S) : Varadarajan Srinvasan et al.

It is certified that error appears in the above-identified patent and that said Letters Patent is hereby corrected as shown below:

In the Claims:

Claim 20, column 27, line 10, change "whether addresses the address" to --whether the address--.

This certificate supersedes the Certificate of Correction issued June 24, 2008.

Signed and Sealed this

Twenty-second Day of July, 2008

JON W. DUDAS
*Director of the United States Patent and Trademark Office*